(12) United States Patent
Shimizu et al.

(10) Patent No.: US 8,891,220 B2
(45) Date of Patent: Nov. 18, 2014

(54) OVERCURRENT CUTOFF DEVICE, AND OVERCURRENT DETECTING ELEMENT TO BE USED IN OVERCURRENT CUTOFF DEVICE

(75) Inventors: Tatsuya Shimizu, Yokkaichi (JP); Kouji Nishi, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 328 days.

(21) Appl. No.: 13/393,757

(22) PCT Filed: Sep. 22, 2010

(86) PCT No.: PCT/JP2010/066369
§ 371 (c)(1),
(2), (4) Date: Mar. 1, 2012

(87) PCT Pub. No.: WO2011/040295
PCT Pub. Date: Apr. 7, 2011

(65) Prior Publication Data
US 2012/0170164 A1 Jul. 5, 2012

(30) Foreign Application Priority Data

Sep. 29, 2009 (JP) .................. 2009-224981
Jun. 25, 2010 (JP) .................. 2010-145217
Sep. 10, 2010 (JP) .................. 2010-203152

(51) Int. Cl.
*H02H 5/00* (2006.01)
*H02H 5/04* (2006.01)
*H05K 1/02* (2006.01)

(52) U.S. Cl.
CPC ............. *H02H 5/043* (2013.01); *H05K 1/0263* (2013.01); *H05K 2201/10053* (2013.01); *H05K 2201/10151* (2013.01); *H05K 2201/10628* (2013.01)
USPC ........................................ 361/103

(58) Field of Classification Search
USPC ........................................ 361/103
See application file for complete search history.

(56) References Cited

U.S. PATENT DOCUMENTS 3,555,355 A * 1/1971 Pfister et al. .................... 361/27
6,100,745 A * 8/2000 Dougherty .................... 327/512

(Continued)

FOREIGN PATENT DOCUMENTS

JP  A-08-032361  2/1996
JP  A-08-075564  3/1996

(Continued)

OTHER PUBLICATIONS

Office Action issued in Chinese Patent Application No. 201080043237.8 dated Jan. 6, 2014 (with translation).

(Continued)

*Primary Examiner* — Stephen W Jackson
(74) *Attorney, Agent, or Firm* — Oliff PLC

(57) ABSTRACT

An overcurrent cutoff device includes a heat generating unit located in series with a path leading from a battery B for a vehicle to a motor via a wire, and a heat sensing unit with characteristics varying with the temperature supplied from the heat generating unit. The overcurrent cutoff device cuts off overcurrent by activating a switching element, based on a signal in accordance with the temperature obtained from the heat sensing unit. The overcurrent cutoff device includes an overcurrent detecting element in which the heat generating unit and the heat sensing unit are integrally covered with a molded resin section.

20 Claims, 23 Drawing Sheets

(56) References Cited

U.S. PATENT DOCUMENTS

| | | | |
|---|---|---|---|
| 6,349,022 B1 * | 2/2002 | Myong et al. | 361/93.1 |
| 6,407,910 B1 * | 6/2002 | Diaz et al. | 361/679.37 |
| 7,978,452 B2 * | 7/2011 | Hein | 361/93.1 |
| 2003/0123205 A1 | 7/2003 | Ashiya | |

FOREIGN PATENT DOCUMENTS

| | | |
|---|---|---|
| JP | A-10-108357 | 4/1998 |
| JP | A-10-285790 | 10/1998 |
| JP | A-2000-069715 | 3/2000 |
| JP | A-2003-189460 | 7/2003 |

OTHER PUBLICATIONS

International Search Report issued in International Application No. PCT/JP2010/066369 dated Dec. 7, 2010.
Written Opinion of International Searching Authority issued in International Application No. PCT/JP2010/066369 dated Dec. 7, 2010 (with trans).
Office Action dated Jul. 29, 2014 issued in Japanese Patent Application No. 2010-203152 (with English Translation).
May 13, 2014 Notification of Reasons for Refusal issued in Japanese Patent Application No. 2010-203152 (with English translation).
Office Action dated Aug. 5, 2014 issued in Chinese Patent Application No. 201080043237.8 (with translation).

* cited by examiner

OVERCURRENT CUTOFF DEVICE, AND OVERCURRENT DETECTING ELEMENT TO BE USED IN OVERCURRENT CUTOFF DEVICE

TECHNICAL FIELD

The present invention relates to an overcurrent cutoff device, and an overcurrent detecting element to be used in an overcurrent cutoff device.

BACKGROUND ART

When overcurrent is generated in a path leading from a power source for a vehicle such as a hybrid vehicle or an electric vehicle to a load via a wire, the temperature of the wire becomes higher, and troubles might be generated such as smoke from an insulating coating or the like. Therefore, an overcurrent cutoff device that cuts off current is provided in case of overcurrent generation.

Conventionally, a fuse element is used in such an overcurrent cutoff device. However, a fuse melts at the time of overcurrent cutoff, and therefore, needs to be replaced with a new one. In view of this, an overcurrent cutoff device that does not use a fuse has been suggested to eliminate the trouble of maintenance or the like.

Patent Document 1 discloses an overcurrent cutoff device in which a PTC element is wound around a circuit conductor, and the PTC element is connected to a signal line. When overcurrent is applied to the circuit conductor, and the temperature of the circuit conductor becomes higher, the temperature of the PTC element also becomes higher. The resistance value in the PTC element then changes, and the voltage at both ends of the PTC element (the current flowing in the PTC element) changes. Based on the voltage (the current), the circuit is cut off, such that overcurrent generation is prevented.

CITATION LIST

Patent Document (Patent Document 1)
Japanese Patent Application Laid-Open No. 10-108357
FIG. 15 shows the current with which a wire generates smoke and time characteristics. The temperature of the wire becomes higher with increase in current. However, if overcurrent flows in a short time (inrush current or the like), the temperature of the wire does not reach the smoke generation temperature, and the wire does not generate smoke. As the overcurrent flowing time becomes longer, the temperature of the wire reaches the smoke generation temperature, and the wire easily generates smoke.

In the above structure disclosed in Patent Document 1, when overcurrent flows in the circuit conductor, the circuit conductor generates heat. The PTC element is instantly heated by the heat, and a change is caused in the resistance value. Therefore, in the overcurrent cutoff device that cuts off the circuit in accordance with the resistance value in the PTC element, the circuit is cut off though a rise in the smoke generation temperature of the wire is still allowed. As a result, high-precision overcurrent cutoff cannot be performed.

Therefore, there is a need in the art to provide an overcurrent cutoff device that performs high-precision overcurrent cutoff, and an overcurrent detecting element to be used in an overcurrent cutoff device.

SUMMARY

An overcurrent cutoff device according to the present invention is an overcurrent cutoff device that includes a heat generating unit located in series with a path leading from a power source for a vehicle to a load via a wire, and a heat sensing unit with characteristics varying with the temperature supplied from the heat generating unit. The overcurrent cutoff device cuts off overcurrent by activating an element for cutting off current, based on a signal in accordance with the temperature obtained from the heat sensing unit. The overcurrent cutoff device includes an overcurrent detecting element having the heat generating unit and the heat sensing unit integrally covered with a molded resin section.

An overcurrent detecting element according to the present invention is an overcurrent detecting element to be used in an overcurrent cutoff device that includes a heat generating unit located in series with a path leading from a power source for a vehicle to a load via a wire, and a heat sensing unit with characteristics varying with the temperature supplied from the heat generating unit. The overcurrent cutoff device cuts off overcurrent by activating an element for cutting off current, based on a signal in accordance with the temperature obtained from the heat sensing unit. The heat generating unit and the heat sensing unit are integrally covered with a molded resin section, to form the overcurrent detecting element.

According to the present invention, the overcurrent detecting element in which the heat generating unit and the heat sensing unit are integrally covered with the molded resin section is provided. Accordingly, the thermal time constant of the temperature obtained at the heat sensing unit and time characteristics can be made closer to the thermal time constant of the temperature allowed for the wire and time characteristics, compared with that in a case where the molded resin section is not provided. Thus, in a situation where a change in current is in a transitional condition, the element for cutting off current can be prevented from operating to cut off current when a rise in the temperature of the wire is still allowed. In this manner, overcurrent cutoff can be performed with high precision.

As described above, the present invention can provide an overcurrent cutoff device that performs high-precision overcurrent cutoff, and an overcurrent detecting element to be used in an overcurrent cutoff device.

EXPLANATION OF REFERENCE NUMERALS

Figure 1:
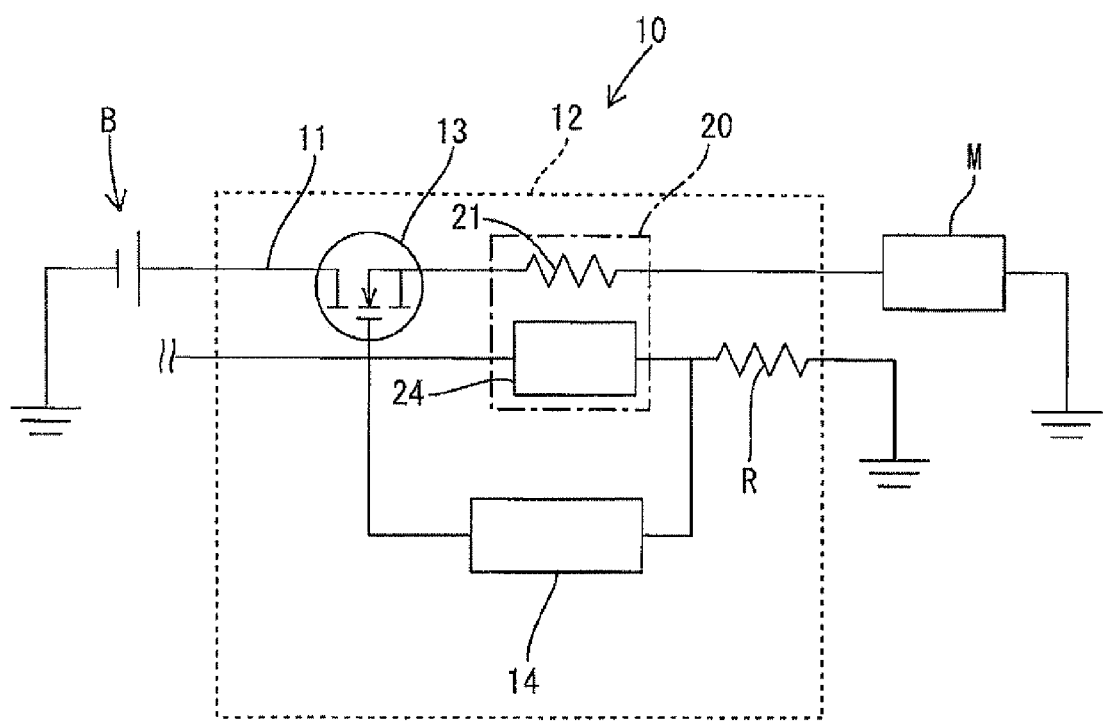
FIG. 1 is a diagram showing the electrical configuration of an overcurrent cutoff device according to a first embodiment.

10 . . . overcurrent cutoff device
11 . . . conducting path
12 . . . circuit board
13 . . . switching element (element for cutting off current)
14 . . . control circuit unit
20, 70, 90 . . . overcurrent detecting elements
21, 58, 71, 91 . . . heat generating units
22, 54, 55, 73, 74, 93, 94 . . . extending portions
23, 53, 75, 95 . . . detour portions
24, 57, 72, 96 . . . heat sensing units
25 . . . terminal units
26 . . . heat-generating-side terminals
27, 51, 52, 99 . . . heat-sensing-side terminals
30, 100 . . . molded resin sections
56 . . . wire
60 . . . barrel unit
95C . . . third path (turnback portion)
B . . . battery (power supply)
M . . . motor (load)
G . . . gap

BEST MODE FOR CARRYING OUT THE INVENTION

<First Embodiment>

Referring to FIGS. 1 through 10, a first embodiment of an overcurrent cutoff device according to the present invention is described below. An overcurrent cutoff device 10 is provided in a path from a battery B (an example of the "power source" in the claims) serving as the power source for driving of a vehicle such as an electric vehicle or a hybrid vehicle, to a motor L (an example of the "load" in the claims) via an electric wire.

As shown in FIG. 1, the overcurrent cutoff device 10 includes: a circuit board 12 having a conducting path 11 connected to the path leading from the battery B to the motor M; an overcurrent detecting element 20 mounted on the circuit board 12; a switching element 13 (an example of the "element for cutting off current" in the claims) that switches on and off the conducting path 11; and a control circuit unit 14 that controls the switching on and off of the switching element 13.

Figure 3:
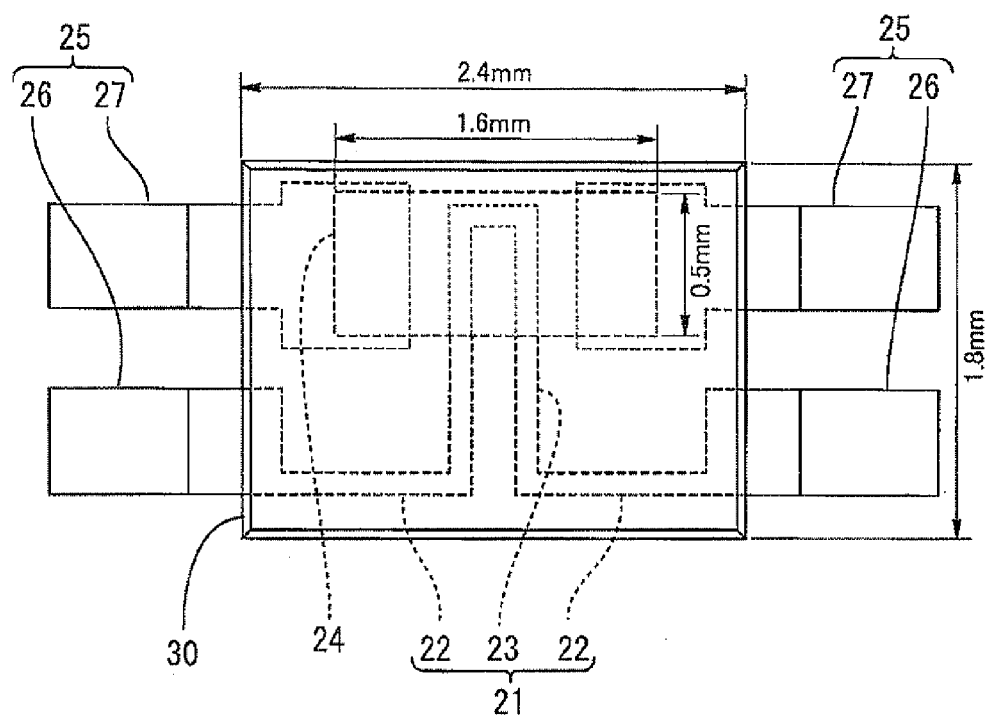
FIG. 3 is a top view of the overcurrent detecting element.

As shown in FIG. 3, the overcurrent detecting element 20 includes: a heat generating unit 21 connected in series to the conducting path 11; a heat sensing unit 24 that is placed near the heat generating unit 21, and senses (detects) the temperature of the heat generating unit 21; terminal units 25 that connect the heat generating unit 21 and the conducting path 11, and connect the heat sensing unit 24 and the conducting path 11; and a molded resin section 30 (molded resin) that integrally covers the heat generating unit 21 and the heat sensing unit 24. The overcurrent detecting element 20 has a shape such that the four terminal units 25 are exposed to the outside from the rectangular molded resin section 30.

Figure 2:
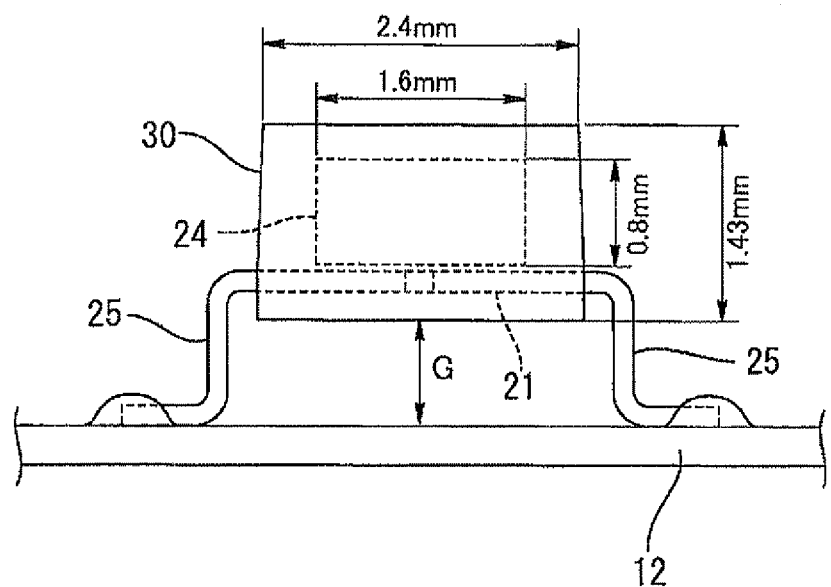
FIG. 2 is a diagram showing a situation where an overcurrent detecting element is mounted on a circuit board.

The terminal units 25 include a pair of heat-generating-side terminals 26 connected to both ends of the heat generating unit 21, and a pair of heat-sensing-side terminals 27 connected to both ends of the heat sensing unit 24. The heat-generating-side terminals 26 and the heat-sensing-side terminals 27 are arranged parallel to each other pair. The end portions of the heat-sensing-side terminals 27 on the sides of the heat sensing unit 24 are made to have greater widths and serve as placement portions 27A. The heat sensing unit 24 is placed on the pair of placement portions 27A in a manner such that the heat sensing unit 24 bridges the placement portions 27A. As shown in FIG. 2, the terminal units 25 have crank-like side faces. Each of the terminal units 25 protrudes horizontally from the molded resin section 30 to the outside, and is bent downward into an L shape. Each of the terminal units 25 further has its lower end portion bent outward. The lower end portion of each of the terminal units 25 serves as a contact portion in contact with the conducting path 11 on the surface of the circuit board 12, and is connected to the conducting path 11 by soldering or the like.

Here, the length of each terminal unit 25 extending downward is equal to the length of the lower end portion thereof protruding downward from the lower end of the molded resin section 30, such that a gap G is formed between the lower end of the molded resin section 30 and the surface of the circuit board 12.

The heat generating unit 21 is connected in series to the path that supplies power from the battery B to the motor M. As shown in FIG. 3, the heat generating unit 21 is integrally formed with the heat-generating-side terminals 26, and is connected in series between the two heat-generating-side terminals 26.

Figure 4:
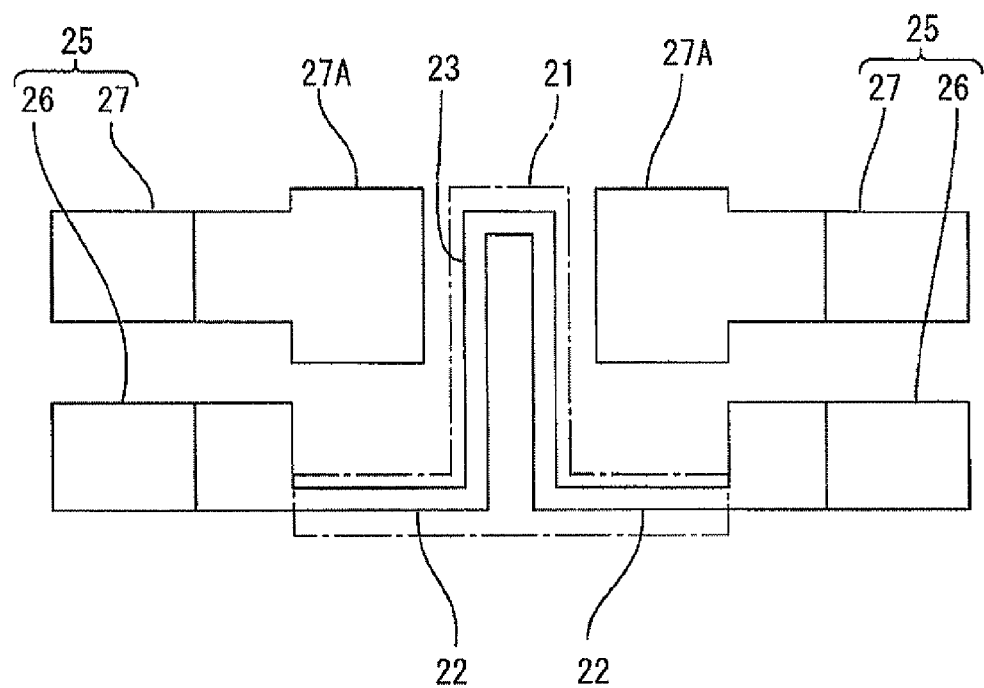
FIG. 4 is a top view of a heat generating unit and terminal units.

As shown in FIG. 4, the heat generating unit 21 includes: extending portions 22 extending in the same directions as the heat-generating-side terminals 26; and a detour portion 23 that detours between the extending portions 22 and connects the extending portions 22.

The widths (the sizes in the vertical direction in FIG. 4) of the extending portions 22 are made smaller (smaller in diameter) stepwise with respect to the widths of the heat-generating-side terminals 26 (that is, the cross-sectional areas of the extending portions 22 are made smaller stepwise with respect to the cross-sectional areas of the heat-generating-side terminals).

The width (the cross-sectional area) of the detour unit 23 is the same as that of the extending portions 22, and detours in the same plane as the extending portions 22, drawing a rectangular shape minus a side on the side of the heat sensing unit 24. The top end portion of the detour portion 23 is located substantially across the entire heat sensing unit 24 in the width direction (in the vertical direction in FIG. 3).

By making the width (the cross-sectional area) of the heat generating unit 21 smaller (smaller in diameter) than the heat-generating-side terminals 26, the resistance value of the heat generating unit 21 is made greater, and heat generation is facilitated. When current is supplied to the motor M via the heat generating unit 21, heat is generated in accordance with the resistance R1, which is equal to the resistivity ρ (length l/cross-sectional area S), of the heat generating unit 21. Accordingly, by changing the width (the diameter), which is a factor to determine the cross-sectional area of the heat generating unit 21, the resistance value of the heat generating unit 21 or the amount of heat generation can be set at a desired value. It should be noted that the resistance value in the heat generating unit 21 in this embodiment is 9 mΩ.

A NTC thermistor is used as the heat sensing unit 24. The NTC thermistor is a thermistor in which resistance decreases with increase in temperature. The longitudinal end portions of a rectangular thermistor body containing an internal electrode are covered with a metal plating using Pb or the like. One end of the thermistor is connected to the conducting path 11 on the side of the battery B, and the other end is grounded via a resistance R.

The distance between the heat generating unit 21 and the heat sensing unit 24 is set at a distance (50 μm in this embodiment) such that almost the same temperature and time characteristics as those of the later described wire ("CHFUS 0.13 sq", manufactured by Sumitomo Wiring Systems, Ltd., is used in this embodiment) are achieved, as the heat generated from the heat generating unit 21 propagates through the molded resin section 30 filling the space between the heat generating unit 21 and the heat sensing unit 24.

The molded resin section 30 has a rectangular parallelepiped shape, and is filled with synthetic resin without any space, such that the molded resin section 30 contains the entire heat generating unit 21 and the entire heat sensing unit 24. The synthetic resin may be one of various known materials such as thermosetting resin (epoxy resin or the like) and thermoplastic resin (polyethylene, polypropylene, or the like).

In this embodiment, epoxy resin is used as the molded resin section 30. The molded resin section 30 has a shape such that the size in the width direction (2.4 mm in the horizontal direction in FIG. 3 in this embodiment) is the largest, the size in the depth direction (1.8 mm in the vertical direction in FIG. 3 in this embodiment) is smaller than that, and the size in the vertical direction (1.43 mm in the vertical direction in FIG. 2 in this embodiment) is even smaller than the size in the depth direction.

Here, the volume (or the resin amount) of the molded resin section 30 is set at a value such that the thermal time constant $\tau 1$ ("6.4 sec" in this embodiment: $\tau 1=\{(1-1/e)\Delta T\}$) of the temperature sensed by the heat sensing unit 24 and time characteristics becomes closer to the thermal time constant $\tau 0$ ("20 sec" in this embodiment) of the temperature and time characteristics of the wire than to the thermal time constant $\tau h$ of the temperature and time characteristics of the fuse, for example.

The reason for that is as follows. When the switching element 13 is turned on, current flows to the conducting path 11, power is supplied to the motor M, and the heat generating unit 21 generates heat.

Figure 5:
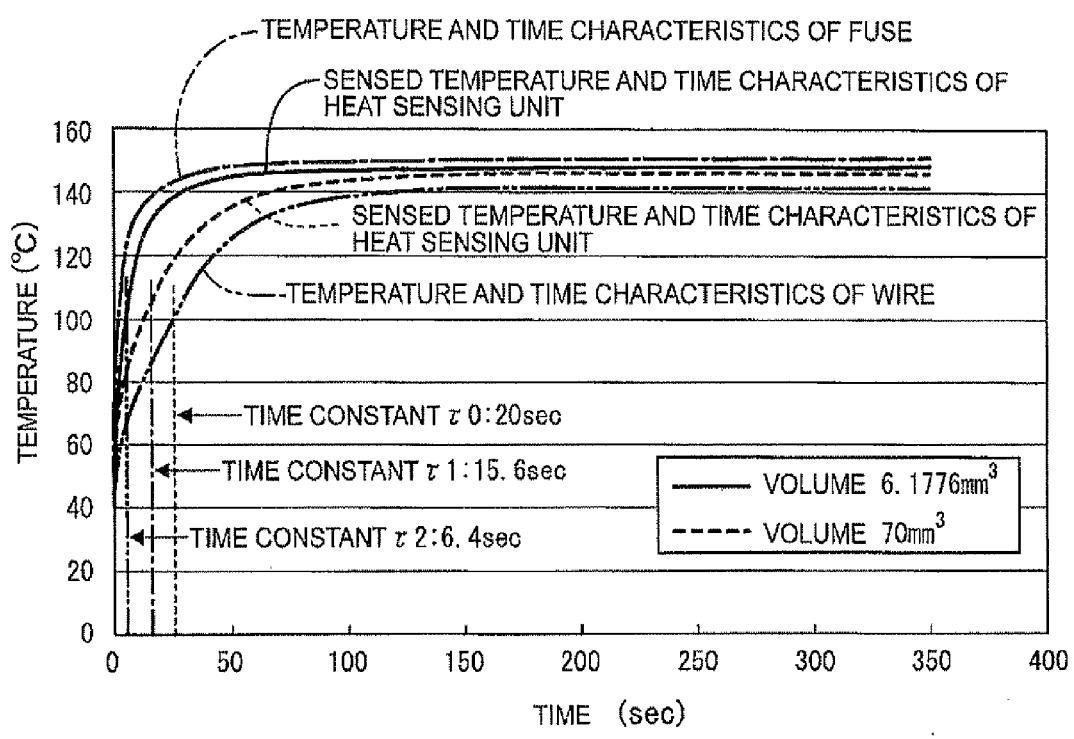
FIG. 5 is a graph showing the temperature and time characteristics of a heat sensing unit.

Since the electric resistance of the wire is low, the temperature of the wire does not instantly reach the temperature corresponding to the current value at this point, and the temperature and time characteristics become as shown in FIG. 5.

Meanwhile, the temperature of the heat generating unit 21 connected in series to the conducting path 11 rapidly increases (not shown) with the amount of current in the conducting path 11, since the resistance value in the heat generating unit 21 is large.

The heat generated from the heat generating unit 21 reaches the heat sensing unit 24 via the molded resin section 30. The temperature sensed by the heat sensing unit 24 at this point has temperature and time characteristics in accordance with the volume of the molded resin section 30 (the volume including the portions of the heat generating unit 21, the heat sensing unit 24, and the terminal units 25 buried in the molded resin section 30).

Specifically, as shown in FIG. 5, with the resin volume in this embodiment being 6.1776 mm³ (2.4×1.8×1.43), (the thermal time constant $\tau 1$ of) the temperature and time characteristics of the heat sensing unit 24 become closer to (the thermal time constant $\tau 0$ of) the temperature and time characteristics of the wire than to (the thermal time constant $\tau h$ of) the temperature and time characteristics of the fuse.

Figure 6:
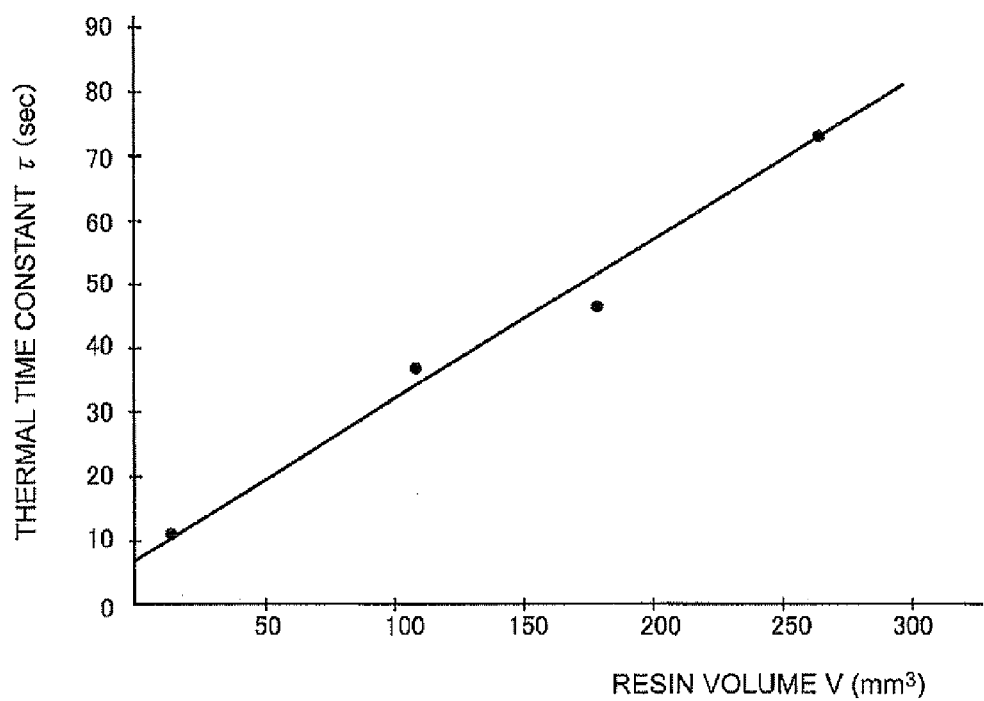
FIG. 6 is a graph showing the thermal time constant and resin volume characteristics of the overcurrent detecting element.
Figure 7:
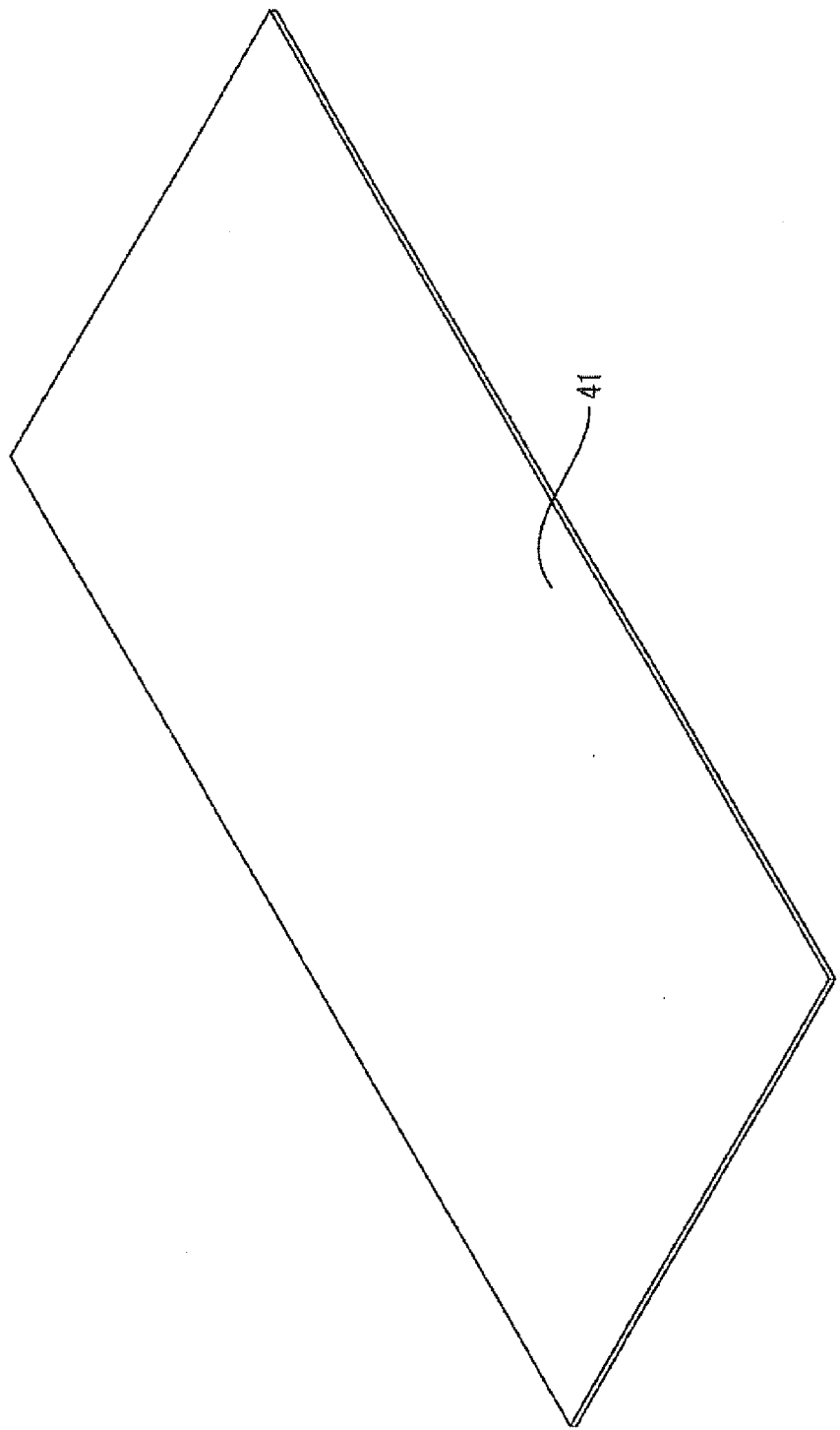
FIG. 7 is a perspective view of a circuit board.
Figure 8:
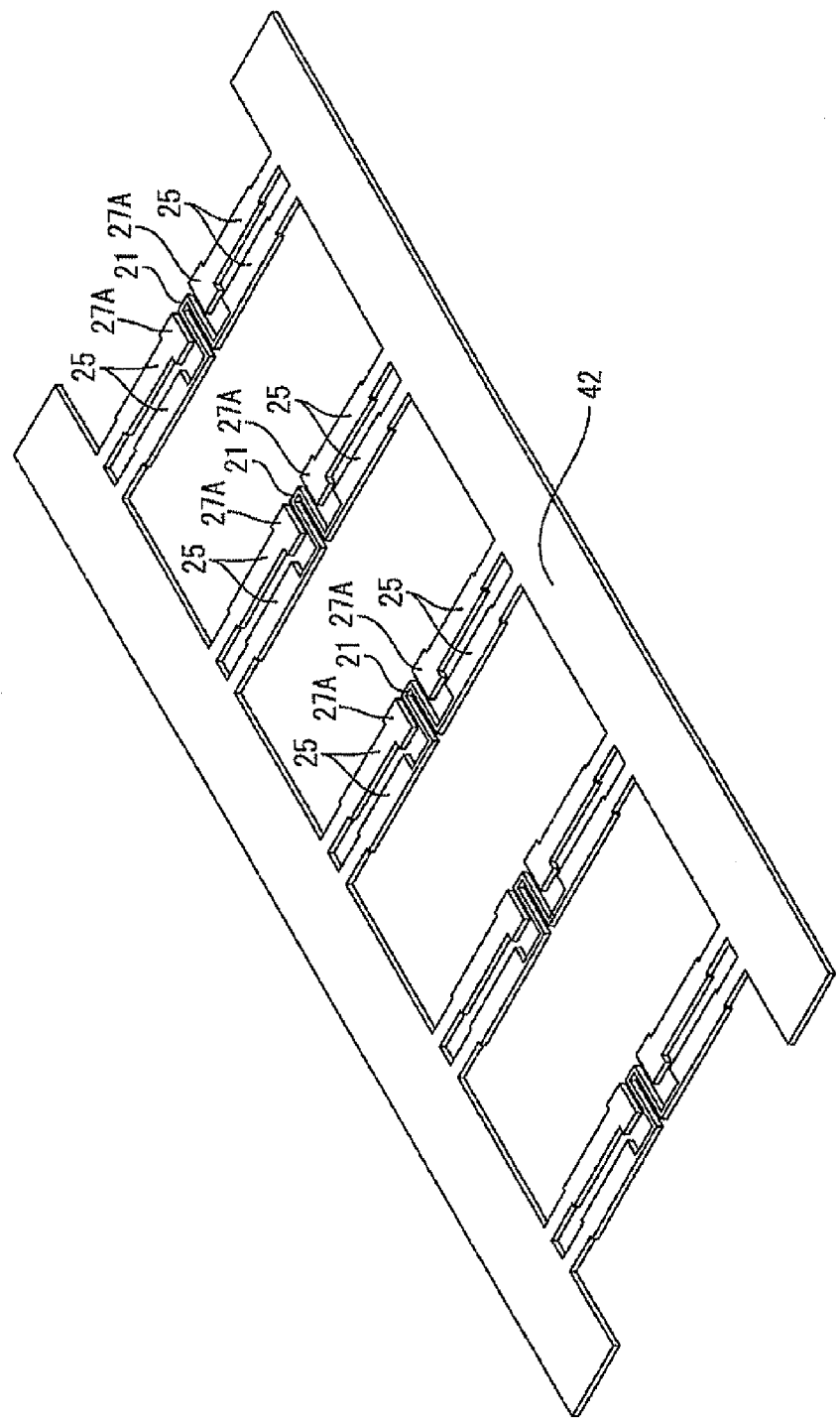
FIG. 8 is a perspective view of an assembly base.

When the resin volume is further increased to increase the volume of the molded resin section 30 to 70 mm³, (the thermal time constant $\tau 2$) of the temperature and time characteristics of the heat sensing unit 24 become even closer to (the thermal time constant $\tau 0$) of the temperature and time characteristics of the wire, as shown in FIG. 5. FIG. 6 shows experimental data on the volume and thermal time constant characteristics of the molded resin section 30. As is apparent from the experimental data, the thermal time constant $\tau$ becomes larger substantially in proportion to the resin volume.

As shown in FIG. 1, the switching element 13 is a semiconductor device mounted on the circuit board 12, and an N-type MOSFET is used as the switching element 13 in this embodiment. Here, the conducting path 11 supplying power to the motor M is connected between the source and the drain, and a signal is supplied from the control circuit unit 14 to the gate such that the power supply to the motor can be cut off.

The control circuit unit 14 compares a voltage output from the heat sensing unit 24 with a predetermined threshold value. If the voltage is higher than the predetermined threshold value, the control circuit unit 14 performs control to turn off the switching element 13.

Figure 9:
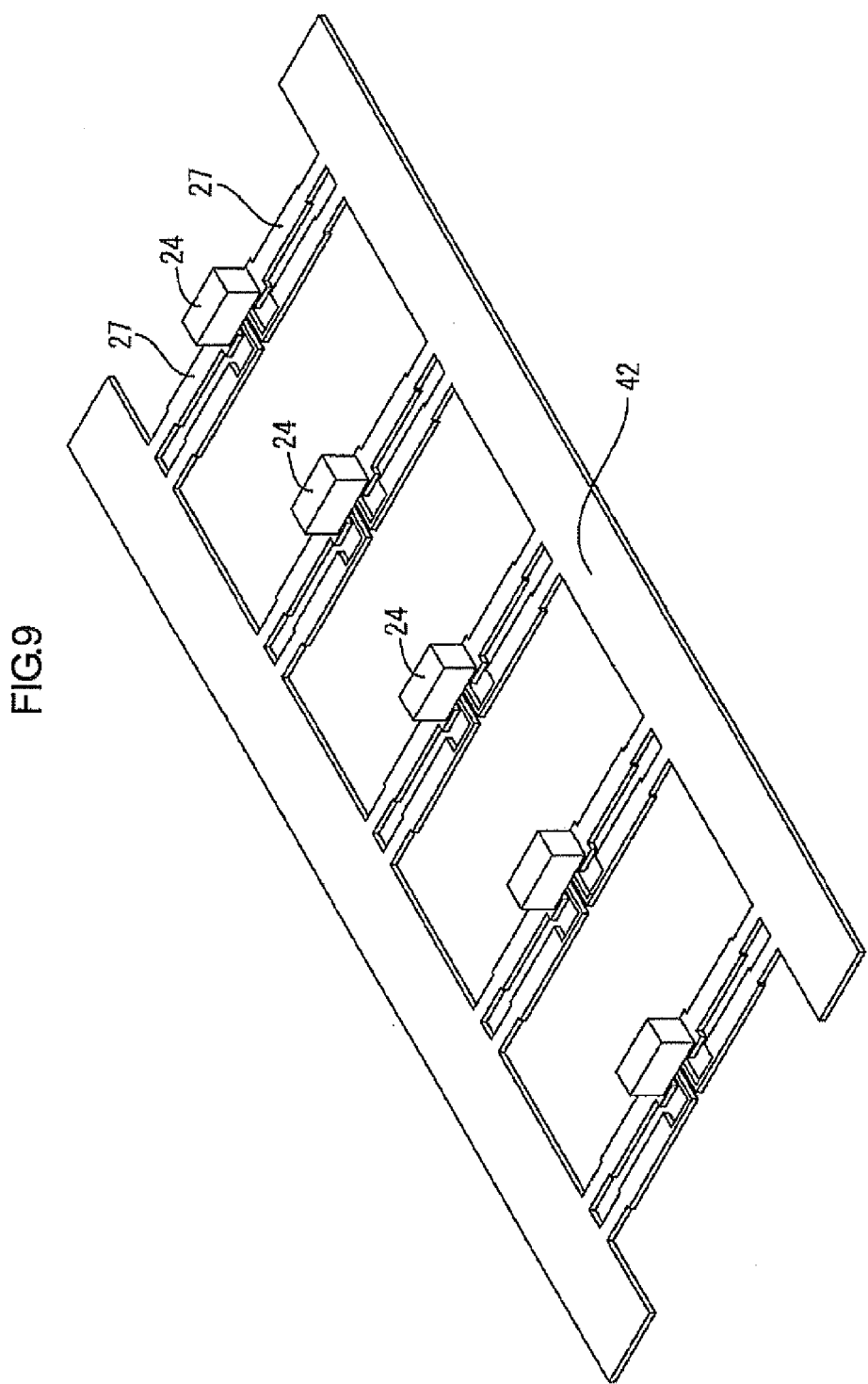
FIG. 9 is a perspective view showing a situation where heat sensing units are mounted on the assembly base.
Figure 10:
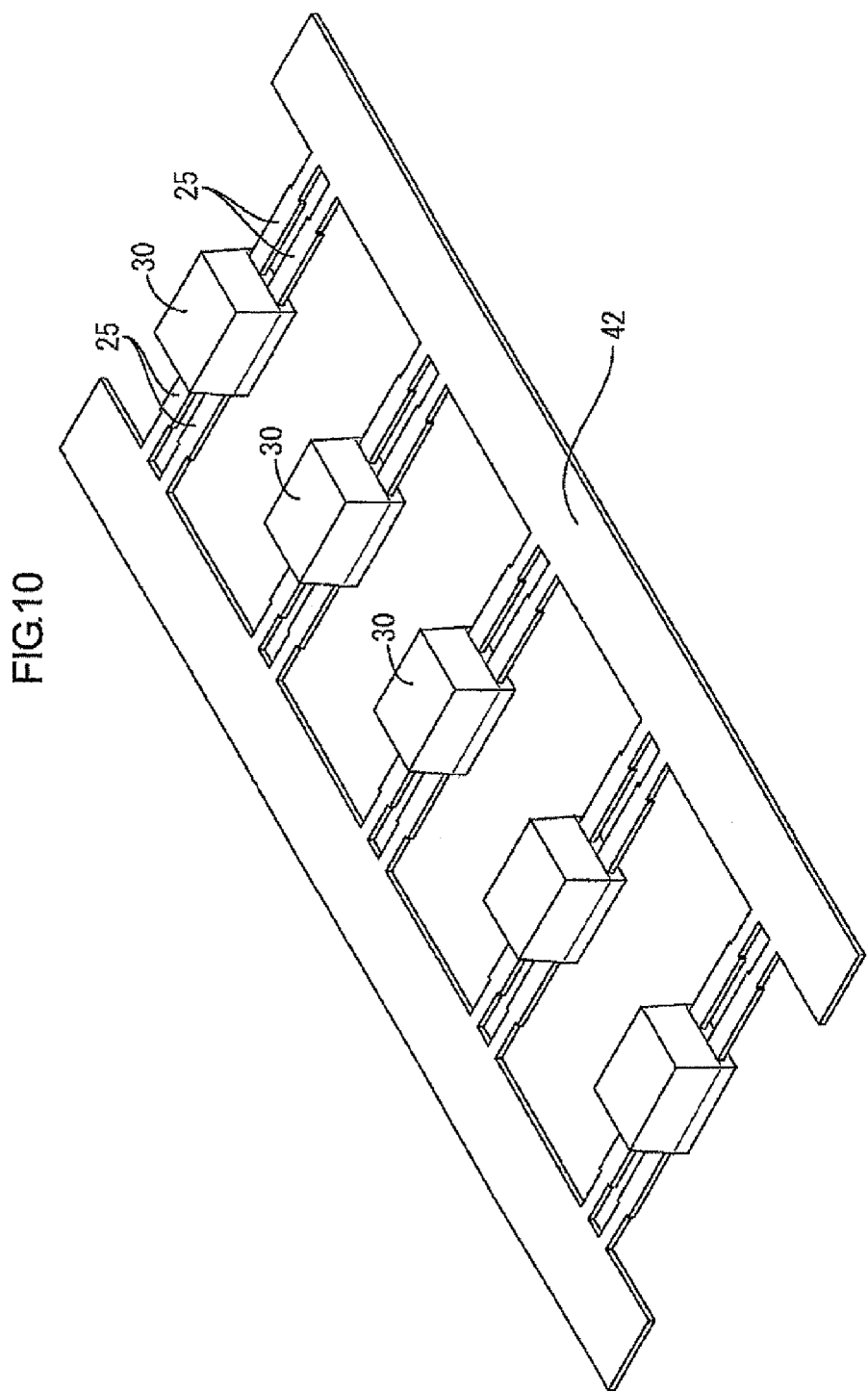
FIG. 10 is a perspective view showing a situation where molded resin sections are formed on the assembly base.

Next, a method of manufacturing the overcurrent detecting element 20 is described. Etching is performed on a flat metal plate material 41 (FIG. 7), to carry out a punching process to form an assembly base 42 (FIG. 8) having the flat terminal units 25 and the flat heat generating units 21 left therein. Solder printing is performed on the placement portions 27A of the heat-sensing-side terminals 27 in the assembly base 42, and the heat sensing units 24 are placed to bridge the respective pairs of placement portions 27A, to perform reflow (FIG. 9). The assembly base 42 is placed in a metal mold, and epoxy resin is introduced into the metal mold to form the molded resin sections 30 (molded resin) (FIG. 10). The terminal units 25 are then separated from the assembly base 42, and are bent into crank-like shapes. The terminal units 25 are then mounted onto the conducting paths 11 on the circuit board 12 by reflow soldering (FIG. 2).

This embodiment can achieve the following effects.

1) According to this embodiment, the overcurrent detecting element 20 has the heat generating unit 21 and the heat sensing unit 24 integrally covered with the molded resin section 30. Accordingly, the thermal time constant $\tau 1$ of the temperature sensed by the heat sensing unit 24 and time characteristics can be made closer to the thermal time constant $\tau 0$ of the temperature allowed for the wire and time characteristics, compared with that in a case where the molded resin section 30 is not provided. Thus, in a situation where a change in current is in a transitional condition, the element for cutting off current can be prevented from operating to cut off current when a rise in the temperature of the wire is still allowed. In this manner, overcurrent cutoff can be performed with high precision.

2) The resin amount in the molded resin section 30 is set such that the heat generated from the heat generating unit 21 is supplied to the heat sensing unit 24 with characteristics in accordance with the temperature allowed for the wire and time characteristics. Accordingly, the heat generated from the heat generating unit 21 is supplied to the heat sensing unit 24 with characteristics in accordance with the temperature allowed for the wire and time characteristics, and the element for cutting off current can be made to operate to cut off overcurrent in accordance with the temperature allowed for the wire and time characteristics. Thus, overcurrent cutoff can be performed with higher precision.

In addition, the signal obtained from the heat sensing unit 24 such as a PTC element may be made to conform to the characteristics of the wire by performing a calculation or the like using a control circuit or the like. In such a case, however, a control circuit or the like is required, and the circuit configuration becomes complicated, which is not desirable in terms of production costs and the like. In this embodiment, on the other hand, the heat sensing unit 24 can be made to output a signal in accordance with the characteristics of the wire, simply by changing the resin amount in the molded resin section 30 (molded resin). Accordingly, the configuration of the overcurrent cutoff circuit can be simplified.

As for the characteristics in accordance with the current allowed for the wire and time characteristics or the temperature allowed for the wire and time characteristics, the resin amount should be set such that heat having the time constant of temperature and time characteristics in accordance with the time constant of the temperature and time characteristics of the wire is supplied to the heat sensing unit 24, for example. Alternatively, the resin amount may be set such that heat having the time constant of temperature and time characteristics in accordance with the time constant of the current and time characteristics of the wire is supplied to the heat sensing unit 24.

3) The resin amount in the molded resin section 30 is set such that the thermal time constant $\tau$ of the temperature obtained from the heat sensing unit 24 and time characteristics falls within a predetermined range with respect to the thermal time constant $\tau 0$ of the temperature allowed for the wire and time characteristics. Accordingly, the thermal time constant $\tau 1$ should be set as the predetermined range in setting the resin amount in the molded resin section 30. Thus, the setting of the resin amount in the molded resin section 30 becomes easier.

4) A signal that is obtained from the heat sensing unit 24 and is in accordance with the temperature is compared with a predetermined threshold value that is set in accordance with the temperature allowed for the wire. Based on the comparison result, the element for cutting off current is activated to cut off overcurrent. Accordingly, the configuration for cutting off overcurrent can be simplified.

5) The overcurrent detecting element 20 is mounted on the circuit board 12, and the gap G is formed between the surface of the circuit board 12 and the molded resin section 30. Accordingly, heat from the circuit board 12 can be prevented from reaching the overcurrent detecting element 20.

<Second Embodiment>

Figure 11:
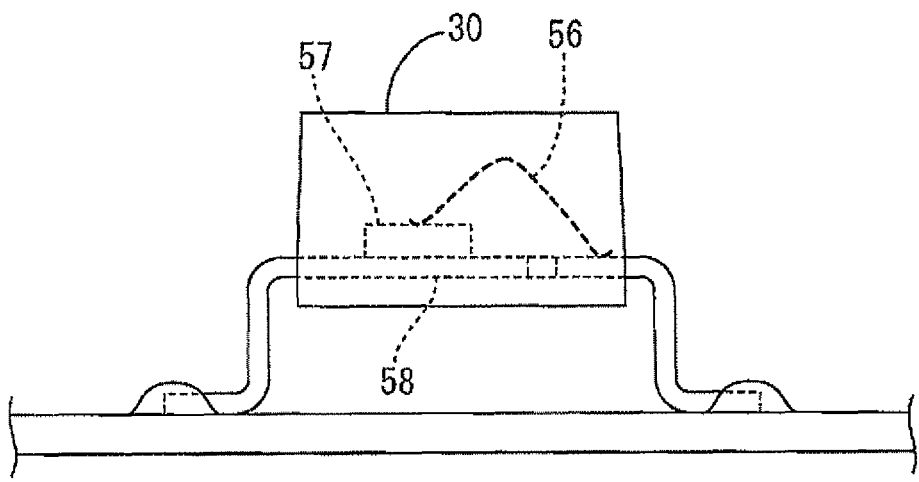
FIG. 11 is a diagram showing a situation where an overcurrent detecting element according to a second embodiment is mounted on a circuit board.
Figure 12:
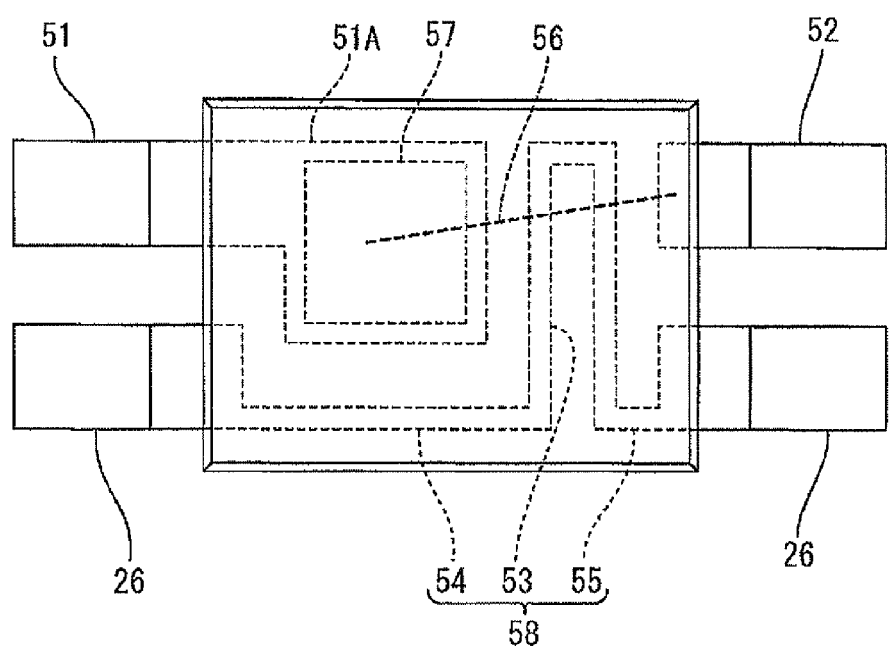
FIG. 12 is a top view of the overcurrent detecting element.
Figure 13:
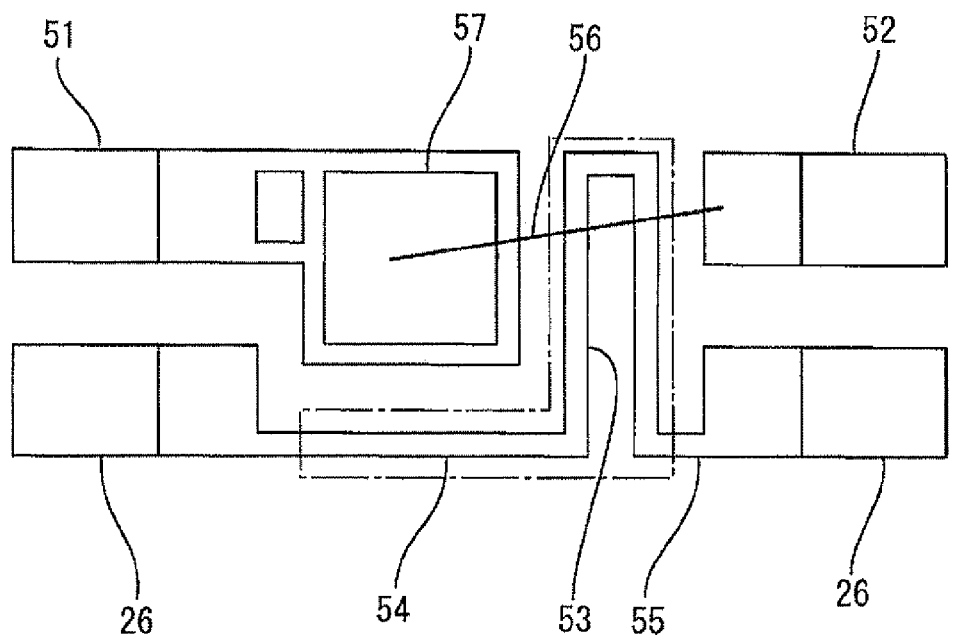
FIG. 13 is a top view of a heat generating unit, a heat sensing unit, and terminal units.

Referring now to FIGS. 11 through 13, a second embodiment of the present invention is described. The same components as those of the first embodiment are denoted by the same reference numerals as those used in the first embodiment, and explanation of them is omitted herein.

In the first embodiment, the heat sensing unit 24 is placed to bridge the heat-sensing-side terminals 27. In the second embodiment, on the other hand, a heat sensing unit 57 is provided at one heat-sensing-side terminal 51, and the other heat-sensing-side terminal 52 and the heat sensing unit 57 are connected by wire bonding, as shown in FIG. 12.

Specifically, in the one heat-sensing-side terminal 51, a placement portion 51A on which the heat sensing unit 57 is placed is located inside the molded resin section 30, and has a size such as to accommodate the entire heat sensing unit 57. The portion of the other heat-sensing-side terminal 52 located inside the molded resin section 30 does not have a placement portion, and has the same shape as the portion extending outside the molded resin section 30. Also, one end of a wire 56 is connected, by wire bonding, to a point on the portion of the heat-sensing-side terminal 52 located inside the molded resin section 30. The other end of the wire 56 is connected to a point on the heat sensing unit 57 by bonding.

A heat generating unit 58 has a long extending portion 54 and a short extending portion 55, such that a detour portion 53 is located between the heat-sensing-side terminals 51 and 52.

<Third Embodiment>

Figure 18:
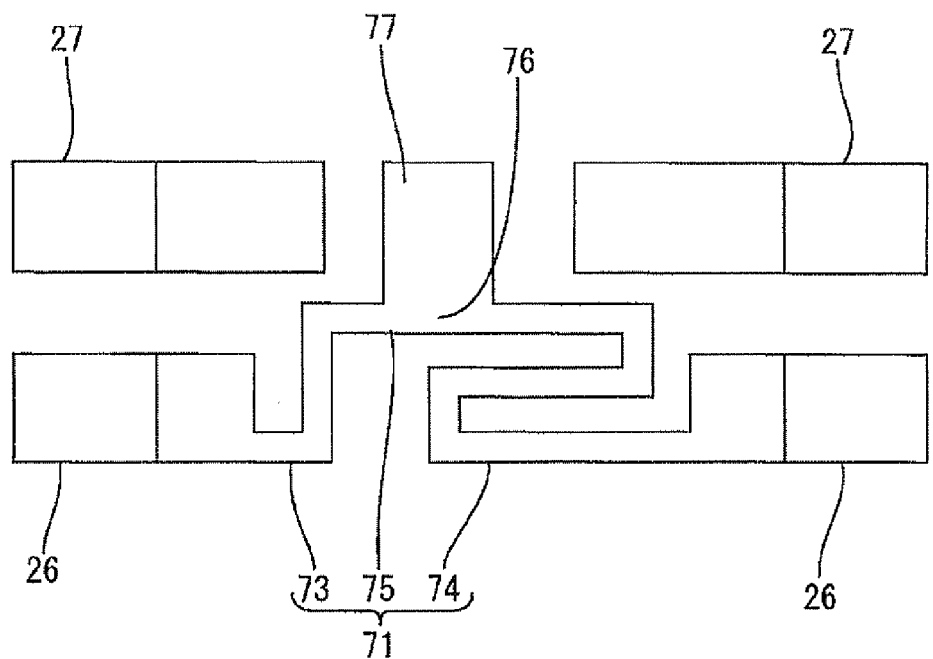
FIG. 18 is a top view of a heat generating unit and terminal units.
Figure 19:
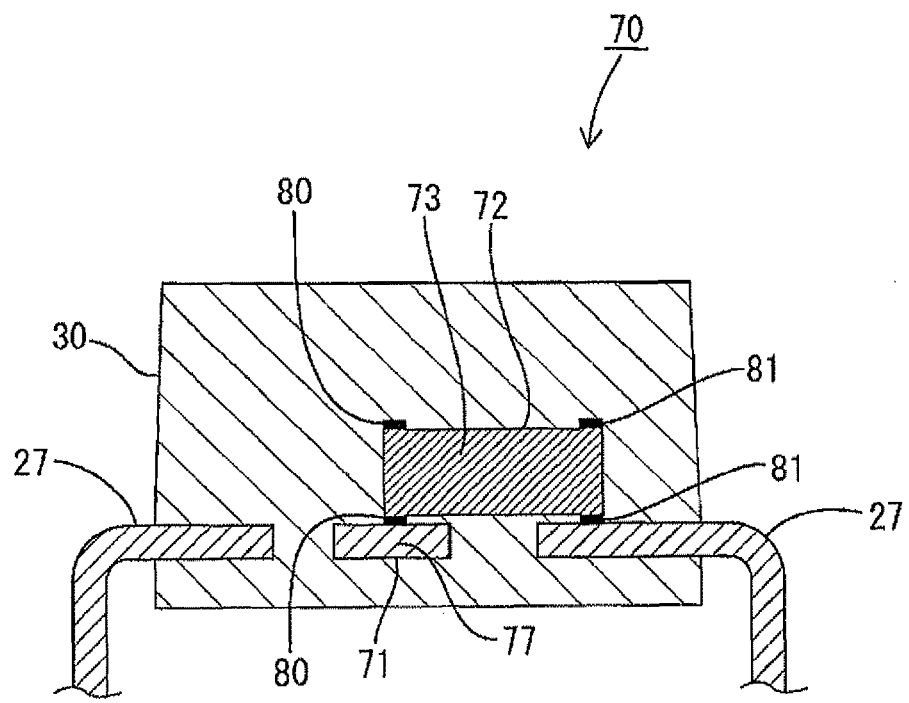
FIG. 19 is an enlarged cross-sectional view of the overcurrent detecting element.
Figure 20:
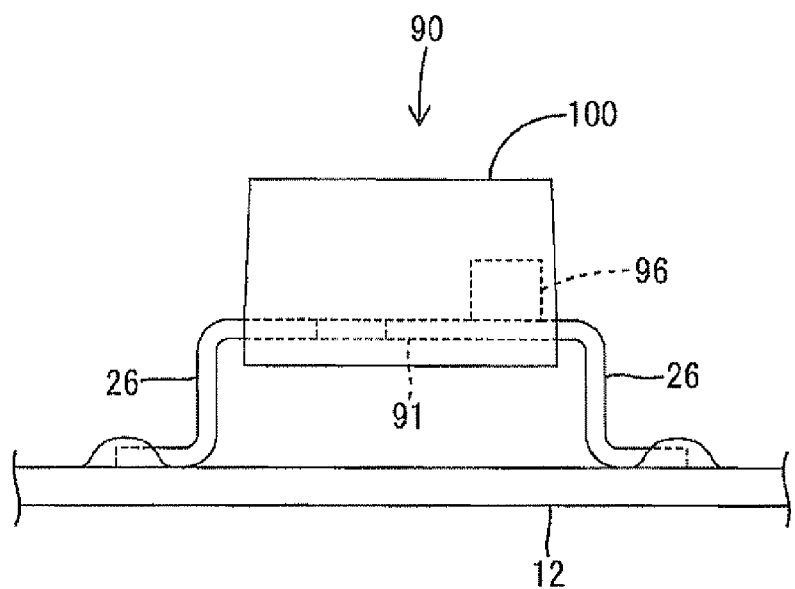
FIG. 20 is a diagram showing a situation where an overcurrent detecting element according to a fourth embodiment is mounted on a circuit board.

Referring now to FIGS. 16 through 19, an overcurrent detecting element 70 of a third embodiment is described. The overcurrent detecting element 20 of each of the foregoing embodiments is designed such that there is a predetermined distance (50 μm) between the heat generating unit 21 and the heat sensing unit 24. In the overcurrent detecting element 70 (FIG. 16) of the third embodiment, a heat generating unit 71 is in contact with an electrode unit 80 of a heat sensing unit 72, as shown in FIG. 19.

Specifically, the heat generating unit 71 includes: extending portions 73 and 74 extending in the same directions as the heat-generating-side terminals 26; and a detour portion 75 that detours between the extending portions 73 and 74, and connects the extending portions 73 and 74, as shown in FIG. 18.

The widths (the sizes in the vertical direction in FIG. 18) of the extending portions 73 and 74 are made smaller (smaller in diameter) stepwise with respect to the widths of the heat-generating-side terminals 26 (that is, the cross-sectional areas of the extending portions 73 and 74 are made smaller stepwise with respect to the cross-sectional areas of the heat-generating-side terminals).

The width (the cross-sectional area) of the detour portion 75 is the same as that of the extending portions 73 and 74. The detour portion 75 detours on the side of the heat sensing unit 72 in the same plane as the extending portions 73 and 74. The detour portion 75 includes: a main conducting path 76 that has the same width (cross-sectional area) as those of the extending portions 73 and 74, and connects the extending portions 73 and 74 with the same widths (cross-sectional areas); and a sub conducting path 77 that extends from the main conducting path 76 toward the heat-sensing-side terminals 27, and forms a placement portion on which the electrode unit 80 of the heat sensing unit 72 is placed.

The main conducting path 76 bends at a right angle from the extending portion 73 toward the heat-sensing-side terminals 27, and again bends at a right angle toward the heat-generating-side terminal 26 on the right-hand side (on the downstream side). On the right-hand side (the downstream side) of the sub conducting path 77, the main conducting path 76 has a crank-like portion toward the back (toward the opposite side from the sub conducting path 77), and the end of the crank-like portion leads to the extending portion 74.

The sub conducting path 77 has a rectangular shape, and the top end portion of the sub conducting path 77 is extended to the position substantially across each heat-sensing-side terminal 27 in the width direction (in the vertical direction in FIG. 18).

The heat sensing unit 72 is a known rectangular NTC thermistor that is long in the width direction. As shown in FIG. 19, the heat sensing unit 72 has electrode units 80 and 81 at both end portions of a multilayer thermistor body 73 in the width direction, and the electrode units 80 and 81 are covered with a Pb plating or the like. One of the electrode units 80 is placed on (in contact with) the sub conducting path 77 of the heat generating unit 71, and the other one of the electrode units 81 is placed on the heat-sensing-side terminal 27 on the right-hand side (the downstream side). The heat sensing unit 72 is smaller than the heat sensing unit 24 of the first embodiment.

The electrode units 80 and 81, (the sub conducting path 77 of) the heat generating unit 71, and the heat-sensing-side terminals 27 are connected in the following manner. A conductive material (a solder or the like) is melted at a high temperature, and is turned into a paste. The conductive material is then applied to the connecting portions, and is solidified (that is, an alloy with a lower melting point than those of the heat generating unit 71 and the electrode unit 80 is melted to serve as an adhesive, and brazing is performed). In this manner, metallic bonding between the heat generating unit 71 and the electrode unit 80 of the heat sensing unit 72 is performed.

The electrode units 80 and 81, (the sub conducting path 77) of the heat generating unit 71, and the heat-sensing-side terminals 27 may be connected not by brazing but with a conductive adhesive that conducts electricity and fixes substances to each other. The conductive adhesive is formed by mixing a resin for fixing and a conducting metal (a conducting filler). For example, epoxy resin can be used as the resin in the conductive adhesive, and Ag (silver) can be used as the metal in the conductive adhesive.

The heat generating unit 71 and the heat sensing unit 72 are integrally covered with the molded resin section 30 (filled with resin without any space).

In the above described structure, the current supplied from the power source flows from the heat-generating-side terminal 26 on the left-hand side (the upstream side) to the heat-generating-side terminal 26 on the right-hand side (the downstream side) through the heat generating unit 71. Also, part of the current flows from the heat generating unit 71 to the heat-sensing-side terminal 27 on the right-hand side (the downstream side) through the sub conducting path 77 and the heat sensing unit 72. Accordingly, temperature detection can be performed by using the current and a voltage drop. Therefore, the heat-sensing-side terminal 27 on the left-hand side (the upstream side) of the overcurrent detecting element 70 is not electrically connected.

The third embodiment achieves the following effects. In the first and second embodiments, the time for the heat sensing unit 24 to sense the heat generated from the heat generating unit 21 is delayed so that overcurrent cutoff can be performed in accordance with the smoke-producing characteristics of the wire. When a large amount of current is supplied in a short period of time, however, overcurrent cutoff might not be performed before smoke generation from the wire due to the time delay (overcurrent cutoff is performed after smoke generation), or a device mounted on the circuit might be broken.

In the third embodiment, on the other hand, the heat generating unit 71 and the heat sensing unit 72 are in contact with each other. Accordingly, when a large amount of current is supplied in a short period of time, the heat from the heat generating unit 71 reaches the heat sensing unit 72 in a short period of time (with a smaller time delay). Even when a large amount of current is supplied in a short period of time, the switching element 13 (the element for cutting off current) can be activated to cut off overcurrent before the wire generates smoke or a device is broken. In a case where a relatively small amount of current is supplied or where the increase in current is relatively slow, on the other hand, overcurrent cutoff can be appropriately performed with a time delay in accordance with the resin amount.

<Fourth Embodiment>

Referring now to FIGS. 20 through 23, an overcurrent detecting element 90 of a fourth embodiment is described. The same components as those of the above described embodiments are denoted by the same reference numerals as those used in the above described embodiments, and explanation of them is omitted herein.

In the third embodiment, the main conducting path 76 and the sub conducting path 77 are provided in the detour portion 75 of the heat generating unit 71. In the fourth embodiment, on the other hand, a sub conducting path is not provided in a detour portion 95 of a heat generating unit 91, and the detour portion 95 is configured only of a main conducting path. Also, in the third embodiment, four terminals including one heat-sensing-side terminal 27 that is not electrically connected are provided. In the fourth embodiment, on the other hand, the overcurrent detecting element 90 is configured of three terminals, and a terminal that is not electrically connected is not provided. It should be noted that, in the fourth embodiment, the heat generating unit and the heat sensing unit are in contact with each other as in the third embodiment.

Figure 21:
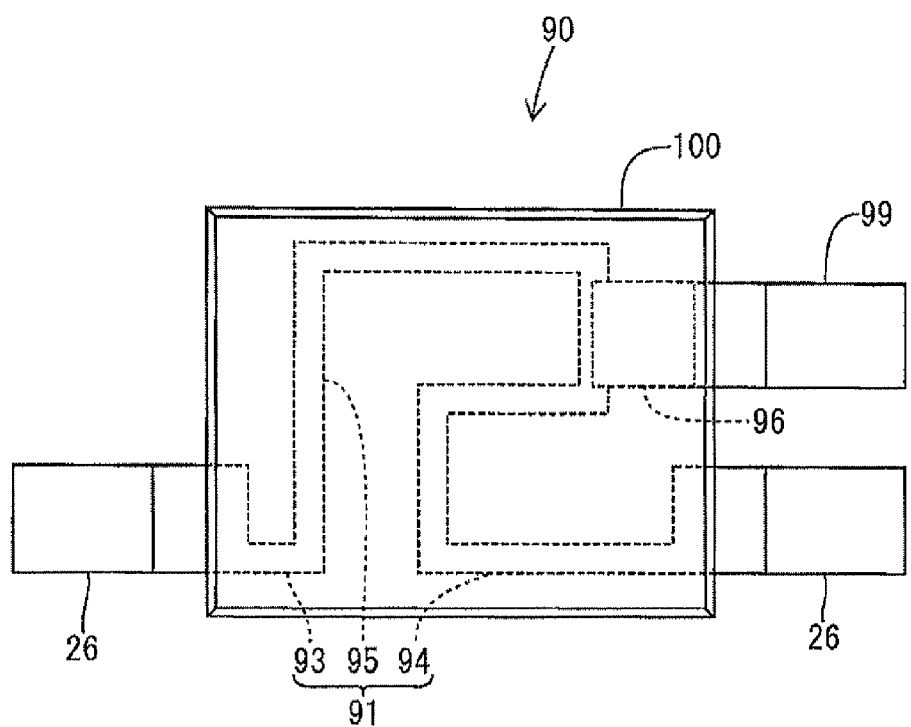
FIG. 21 is a top view of the overcurrent detecting element.

As shown in FIG. 21, the overcurrent detecting element 90 includes the heat generating unit 91, a heat sensing unit 96, three terminals 26, 26 and 99, and a molded resin section 100 that integrally covers the heat generating unit 91 and the heat sensing unit 96 substantially without any space (such as to house the base portions of the terminals).

The three terminals 26, 26 and 99 are a pair of left and right heat-generating-side terminals 26, and one heat-sensing-side terminal 99. The heat-sensing-side terminal 99 has the same configuration as that of one (the right-side one) of the heat-sensing-side terminals 27 in the above described embodiments.

Figure 22:
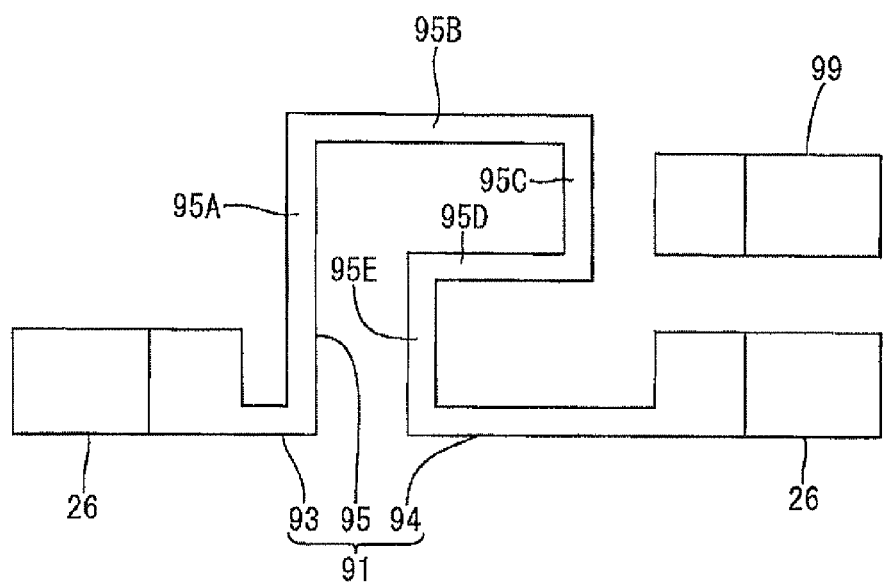
FIG. 22 is a top view of a heat generating unit and terminal units.

As shown in. FIG. 22, the heat generating unit 91 includes: extending portions 93 and 94 that extend in the same directions as the heat-sensing-side terminals 26; and the detour portion 95 that detours between the extending portions 93 and 94, and connects the extending portions 93 and 94.

The widths (the sizes in the vertical direction in FIG. 22) of the extending portions 93 and 94 are made smaller (smaller in diameter) stepwise with respect to the widths of the heat-generating-side terminals 26 (that is, the cross-sectional areas of the extending portions 93 and 94 are made smaller stepwise with respect to the cross-sectional areas of the heat-generating-side terminals 26).

The detour portion 95 has the same width (cross-sectional area) as those of the extending portions 93 and 94, and detours on the side of the heat sensing unit 96 in the same plane as the extending portions 93 and 94. The detour portion 95 connects the two extending portions 93 and 94 with the same widths (cross-sectional areas).

Specifically, the detour portion 95 includes: a first path portion 95A that is bent into an L shape, and extends from the extending portion 93 toward the heat-sensing-side terminal 99; a second path portion 95B that is bent into an L shape at the end of the first path portion 95A, and extends in the same direction as the extending direction of the heat-sensing-side terminal 99; a third path portion 95C that is bend into an L shape at the end of the second path portion 95B, and extends toward the heat-generating-side terminals 26; a fourth path portion 95D that is bent into an L shape at the end of the third path portion 95C, and returns toward the first path portion 95A by a predetermined distance; and a fifth path portion 95E that is bent into an L shape at the end of the fourth path portion 95D, extends toward the extending portion 94, and integrally leads to the extending portion 94.

Figure 23:
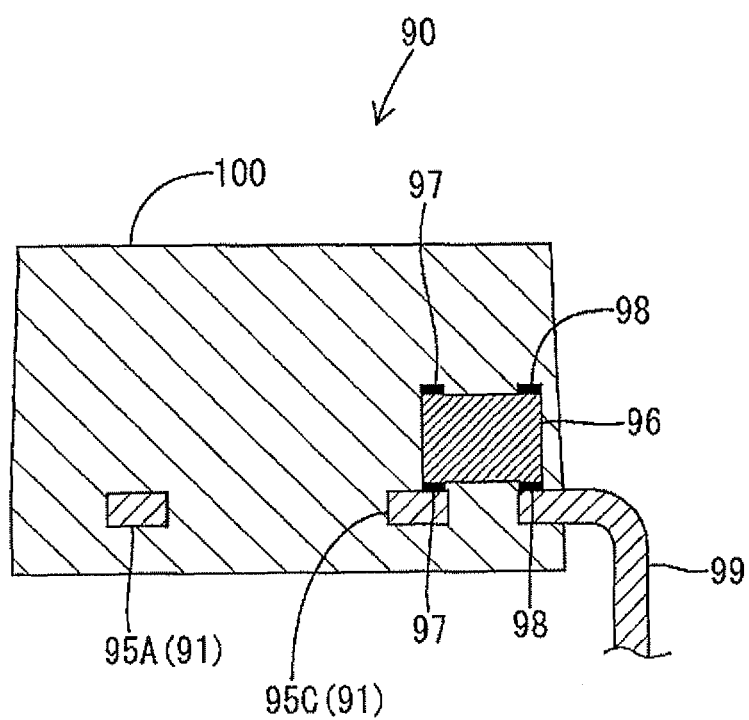
FIG. 23 is an enlarged cross-sectional view of the overcurrent detecting element.

The heat sensing unit 96 is a known rectangular NTC thermistor that is long in the width direction. As shown in FIG. 23, the heat sensing unit 96 has electrode units 97 and 98 at both end portions of a multilayer thermistor body in the width direction, and the electrode units 97 and 98 are covered with a Pb plating or the like. One of the electrode units 97 is placed on (in contact with) the third path portion 95C configuring the turnback portion between the L shape of the second path portion 95B and the L shape of the fourth path portion 95D of the heat generating unit 91, and the other one of electrode units 98 is placed on the heat-sensing-side terminal 99 on the right-hand side (the downstream side). The heat sensing unit 96 is smaller than the heat sensing unit 24 of the first embodiment.

The electrode units 97 and 98, the heat generating unit 91, and the heat-sensing-side terminal 99 are connected in the following manner. A conductive material (a solder or the like) is melted at a high temperature, and is turned into a paste. The conductive material is then applied to the connecting portions, and is solidified (that is, an alloy with a lower melting point than those of the heat generating unit and the electrode units is melted to serve as an adhesive, and brazing is performed). In this manner, metallic bonding between the heat generating unit 91 and one of the electrode units 97 of the heat sensing unit 95 is performed, and metallic bonding between the heat generating unit 91 and the other one of the electrode units 98 is performed.

The electrode units 97 and 98, the heat generating unit 91, and the heat-sensing-side terminal 99 may be connected not by brazing but with a conductive adhesive that conducts electricity and fixes substances to each other. The conductive adhesive is formed by mixing a resin for fixing and a conducting metal (a conducting filler). For example, epoxy resin can be used as the resin in the conductive adhesive, and Ag (silver) can be used as the metal in the conductive adhesive.

The heat generating unit 91 and the heat sensing unit 96 are integrally covered with the molded resin section 100 (filled with resin without any space).

In the above described configuration, the current supplied from the power source flows from the heat-generating-side terminal 26 on the left-hand side (the upstream side) to the heat-generating-side terminal 26 on the right-hand side (the downstream side) through the heat generating unit 91. Also, part of the current flows from the heat generating unit 91 to the heat-sensing-side terminal 99 on the right-hand side (the downstream side) through the heat sensing unit 96. Accordingly, temperature detection can be performed by using the current and a voltage drop.

As described above, in the fourth embodiment, the heat sensing unit 96 has the pair of electrode units 97 and 98, and includes: the pair of heat-sensing-side terminals 26 that lead to the heat generating unit 91, and are connected to the conducting path 11 on the circuit board 12; and the heat-sensing-side terminal 99 connected to the conducting path 11 on the circuit board 12. One of the electrode units 97 of the heat sensing unit 96 is placed on and connected to the heat generating unit 91, and the other one of the electrode units 98 of the heat sensing unit 96 is placed on and connected to the heat-sensing-side terminal 99. With this arrangement, the current from the heat generating unit 91 can flow into the heat-generating-side terminals 26 and the heat sensing unit 96, and can be used in detecting temperature. Also, since the electrode unit 97 of the heat sensing unit 96 is placed on and connected to the heat generating unit 91, the heat from the heat generating unit 91 can easily reach the heat sensing unit 96. Further, since detection can be performed without two heat-sensing-side terminals, the number of terminals can be made smaller than that in a case where two heat-sensing-side terminals are used.

Since brazing is performed to connect one of the electrode units 97 and the heat generating unit 91, and connect the other one of the electrode units 98 and the heat-sensing-side terminal 99, the connection between the electrode unit 97 and the heat generating unit 91, and the connection between the electrode unit 98 and the heat-sensing-side terminal 99 can be certainly performed with a simple configuration.

Further, since one of the electrode units 97 is placed on the third path portion 95C (the turnback portion) that tends to have heat generating portions at a high density, the heat generated from the heat generating unit 91 can easily reach the heat sensing unit 96.

<Other Embodiments>

The present invention is not limited to the embodiments described above with reference to the drawings, but the following embodiments are also included in the technical scope of the present invention, for example.

1) In the above described embodiments, the material of the molded resin section 30 is epoxy resin. However, the material is not limited to that, and may be some other resin.

2) Although the heat sensing unit 24 is a NTC thermistor, some other thermistor such as a PTC thermistor may be used. Also, the heat sensing unit 24 is not necessarily a thermistor, but a device such as a diode that has characteristics varying with temperatures may be used to detect temperatures.

3) Although the distance between the heat generating unit 21 and the heat sensing unit 24 is constant (50 μm) or in contact in the above described embodiment, the distance is not limited to that. In the overcurrent detecting element 20, the temperature obtained from the heat sensing unit 24 and time characteristics may be determined by the distance (with the time constant becoming larger with the increase in the distance) between the heat generating unit 21 and the heat sensing unit 24, as well as by the resin amount (the volume) of the molded resin section 30.

Figure 14:
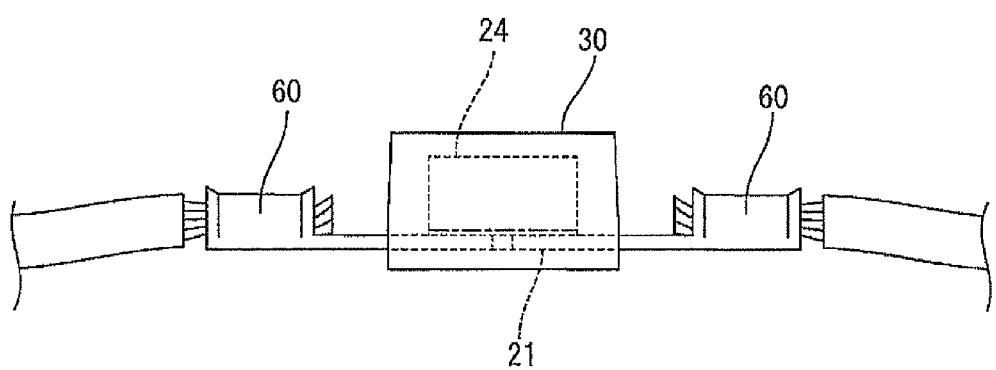
FIG. 14 is a diagram showing a situation where wire terminals are attached to barrel units in place of terminal units.
Figure 15:
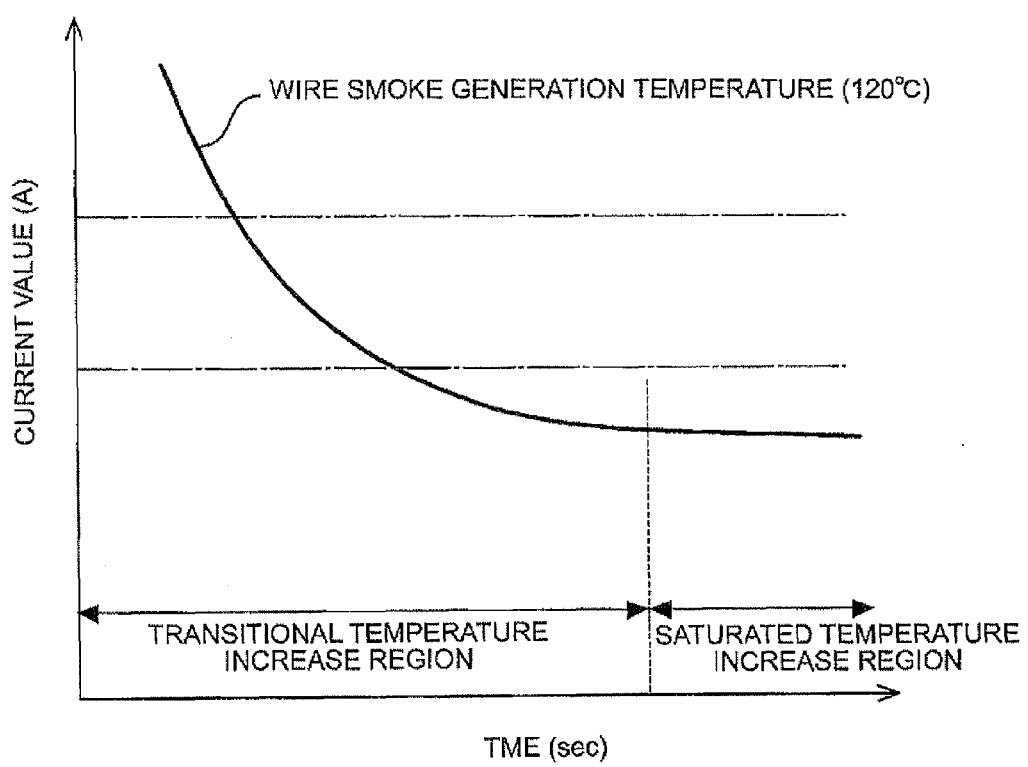
FIG. 15 is a graph showing the current with which the wire generates smoke and time characteristics.
Figure 16:
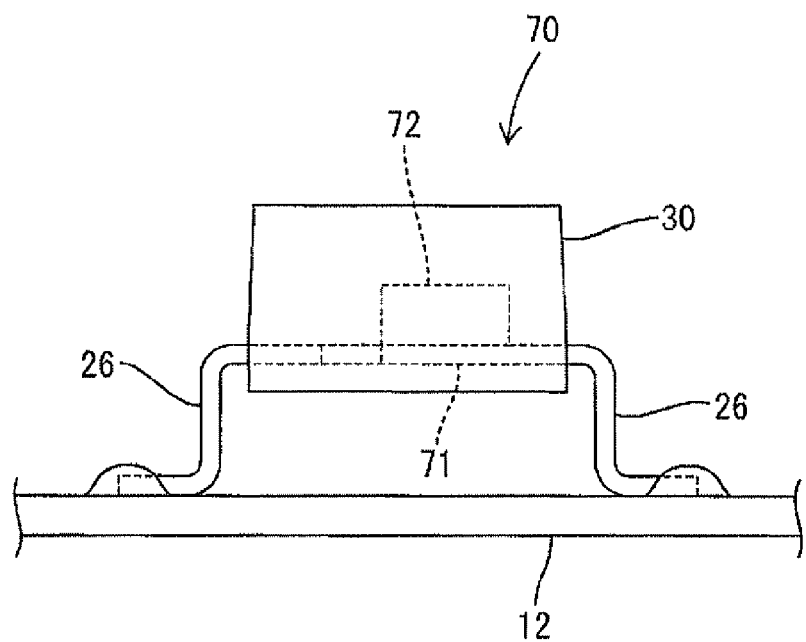
FIG. 16 is a diagram showing a situation where an overcurrent detecting element according to a third embodiment is mounted on a circuit board.
Figure 17:
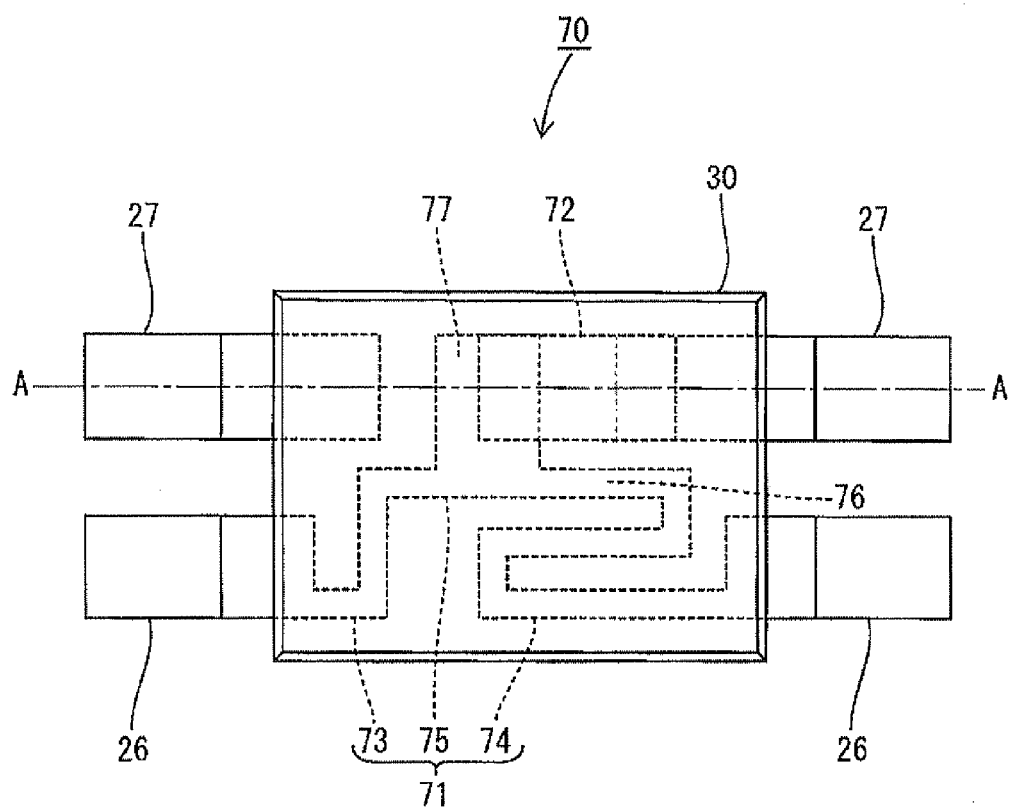
FIG. 17 is a top view of the overcurrent detecting element.

4) In the above described embodiment, the terminal units 25 are connected to the conducting path 11 on the circuit board 12. However, the structure is not limited to that, as shown in FIG. 14, barrel units 60 may be provided in place of the terminal units. The end portions of a wire may be fixed to the barrel units 60. Although not shown in the drawings, a barrel unit 60 may be provided only in place of one of the terminal units, and the other terminal unit may be connected to the conducting path 11 on the circuit board 12.

5) In the above described embodiment, the thermal time constant $\tau 1$ of the temperature and time characteristics of the heat sensing unit 24 is made closer to the thermal time constant $\tau 0$ of the temperature and time characteristics of the wire. However, the present invention is not limited to that, and the temperature and time characteristics of the heat sensing unit 24 may be configured to conform to the temperature and time characteristics of the wire.

6) As for setting of the thermal time constant $\tau 1$ of the temperature and time characteristics of the heat sensing unit 24, the thermal time constant $\tau 1$ may be set at a desired value by forming a notch on the upper portion of the molded resin section 30 and reducing the resin amount (the volume).

7) Alternatively, (the thermal time constant of) the temperature and time characteristics of the heat sensing unit may be made closer to (the thermal time constant of) the temperature and time characteristics of the wire by changing the settings of the heat generating unit 21 (58) or the heat sensing unit 24 (57) as well as the resin amount (volume) in the molded resin section 30.

Means to Solve the Problems

An overcurrent cutoff device according to this embodiment is an overcurrent cutoff device that includes a heat generating unit located in series with a path leading from a power source for a vehicle to a load via a wire, and a heat sensing unit with characteristics varying with the temperature supplied from the heat generating unit. The overcurrent cutoff device cuts off overcurrent by activating an element for cutting off current, based on a signal in accordance with the temperature obtained from the heat sensing unit. The overcurrent cutoff device includes an overcurrent detecting element having the heat generating unit and the heat sensing unit integrally covered with a molded resin section (Means 1).

With the configuration of Means 1, the overcurrent detecting element in which the heat generating unit and the heat sensing unit are integrally covered with the molded resin section is provided. Accordingly, the thermal time constant of the temperature obtained at the heat sensing unit and time characteristics can be made closer to the thermal time constant of the temperature allowed for the wire and time characteristics, compared with that in a case where the molded resin section is not provided. Thus, in a situation where a change in current is in a transitional condition, the element for cutting off current can be prevented from operating to cut off current when a rise in the temperature of the wire is still allowed. In this manner, overcurrent cutoff can be performed with high precision.

In the configuration of Means 1, the molded resin section may have a resin amount to be set such that the heat generated from the heat generating unit is supplied to the heat sensing unit with characteristics in accordance with the temperature allowed for the wire and time characteristics (Means 2).

With the configuration of Means 2, the heat generated from the heat generating unit is supplied to the heat sensing unit with characteristics in accordance with the temperature allowed for the wire and time characteristics, and the element for cutting off current can be made to operate to cut off overcurrent in accordance with the temperature allowed for the wire and time characteristics. Accordingly, overcurrent cutoff can be performed with higher precision.

The signal obtained from the heat sensing unit such as a PTC element may be made to conform to the characteristics of the wire by performing a calculation or the like using a control circuit or the like. In such a case, however, a control circuit or the like is required, and the circuit configuration becomes complicated, which is not desirable in terms of production costs and the like. In Means 2, on the other hand, the heat sensing unit can be made to output a signal in accordance with the characteristics of the wire, simply by changing the resin amount in the molded resin section (molded resin). Accordingly, the configuration of the overcurrent cutoff circuit can be simplified.

As for the characteristics in accordance with the current allowed for the wire and time characteristics or the temperature allowed for the wire and time characteristics, the resin amount should be set so that heat having the time constant of temperature and time characteristics in accordance with the time constant of the temperature and time characteristics of the wire is supplied to the heat sensing unit, for example. Alternatively, the resin amount may be set so that heat having the time constant of temperature and time characteristics in accordance with the time constant of the current and time characteristics of the wire is supplied to the heat sensing unit.

In addition to the configuration of Means 1 or 2, the molded resin section may have a resin amount to be set such that the thermal time constant of the temperature obtained from the heat sensing unit and time characteristics falls within a predetermined range with respect to the thermal time constant of the temperature allowed for the wire and time characteristics (Means 3).

With the configuration of Means 3, the thermal time constant is set within a predetermined range in setting the resin amount in the molded resin section. Accordingly, the resin amount in the molded resin section can be easily set.

In addition to the configuration of Means 2 or 3, in the overcurrent detecting element, the temperature obtained at (or sensed by) the heat sensing unit and time characteristics may be determined by the distance between the heat generating unit and the heat sensing unit, as well as by the resin amount in the molded resin section (Means 4).

With the configuration of Means 4, it is possible to perform overcurrent cutoff that depends on the temperature and time characteristics of the wire to a greater degree.

In addition to the configuration of any of Means 1 through 4, the heat generating unit and the heat sensing unit may be in contact with each other in the overcurrent detecting element (Means 5).

The time for the heat sensing unit to sense the heat generated from the heat generating unit is delayed, so that overcurrent cutoff can be performed in accordance with the smoke-producing characteristics of the wire. When a large amount of current is supplied in a short period of time, however, overcurrent cutoff might not be performed before smoke generation from the wire due to the time delay (overcurrent cutoff is performed after smoke generation), or a device mounted on the circuit might be broken.

With the configuration of Means 5, on the other hand, the heat generating unit and the heat sensing unit are in contact with each other. Accordingly, when a large amount of current is supplied in a short period of time, the heat from the heat generating unit reaches the heat sensing unit in a short period of time (with a smaller time delay). Even when a large amount of current is supplied in a short period of time, the element for cutting off current can be activated to cut off current before the wire generates smoke or a device is broken. In a case where a relatively small amount of current is supplied or where the increase in current is relatively slow, on the other hand, overcurrent cutoff can be appropriately performed with a time delay in accordance with the resin amount.

In addition to the configuration of any of Means 1 through 5, a signal in accordance with the temperature obtained from the heat sensing unit is compared with a predetermined threshold value set in accordance with the temperature allowed for the wire, and, based on the result of the comparison, the element for cutting off current is activated to cut off overcurrent (Means 6).

With the configuration of means 6, the configuration for cutting off overcurrent can be simplified.

In addition to the configuration of any of Means 1 through 6, the overcurrent detecting element is mounted on a circuit board, and a gap may be formed between the surface of the circuit board and the molded resin section (Means 7).

With the configuration of Means 7, the heat from the circuit board can be prevented from reaching the overcurrent detecting element by the formation of the gap between the circuit board and the molded resin section.

An overcurrent detecting element according to this embodiment is an overcurrent detecting element to be used in an overcurrent cutoff device that includes a heat generating unit located in series with a path leading from a power source for a vehicle to a load via a wire, and a heat sensing unit with characteristics varying with the temperature supplied from the heat generating unit. The overcurrent cutoff device cuts off overcurrent by activating an element for cutting off current, based on a signal in accordance with the temperature obtained from the heat sensing unit. The heat generating unit and the heat sensing unit are integrally covered with a molded resin section, to configure the overcurrent detecting element (Means 8).

With the configuration of Means 8, the overcurrent detecting element in which the heat generating unit and the heat sensing unit are integrally covered with the molded resin section is provided. Accordingly, the thermal time constant of the temperature obtained at the heat sensing unit and time characteristics can be made closer to the thermal time constant of the temperature allowed for the wire and time characteristics, compared with that in a case where the molded resin section is not provided. Thus, in a situation where a change in current is in a transitional condition, the element for cutting off current can be prevented from operating to cut off current when a rise in the temperature of the wire is still allowed. In this manner, overcurrent cutoff can be performed with high precision.

In addition to the configuration of Means 8, the molded resin section may have a resin amount to be set such that the heat generated from the heat generating unit is supplied to the heat sensing unit with characteristics in accordance with the temperature allowed for the wire and time characteristics (Means 9).

With the configuration of Means 9, the heat generated from the heat generating unit is supplied to the heat sensing unit with characteristics in accordance with the temperature allowed for the wire and time characteristics, and the element for cutting off current can be made to operate to cut off overcurrent in accordance with the temperature allowed for the wire and time characteristics. Accordingly, overcurrent cutoff can be performed with higher precision.

In addition to the configuration of Means 8 or 9, the molded resin section may have a resin amount to be set such that the thermal time constant of the temperature obtained at the heat sensing unit and time characteristics falls within a predetermined range with respect to the thermal time constant of the temperature allowed for the wire and time characteristics (Means 10).

With the configuration of Means 10, the thermal time constant is set within a predetermined range in setting the resin amount in the molded resin section. Accordingly, the resin amount in the molded resin section can be easily set.

In addition to the configuration of Means 9 or 10, the temperature obtained at the heat sensing unit and time characteristics may be determined by the distance between the heat generating unit and the heat sensing unit in the overcurrent detecting element, as well as by the resin amount in the molded resin section (Means 11).

With the configuration of Means 11, it is possible to perform overcurrent cutoff that depends on the temperature and time characteristics of the wire to a greater degree.

In addition to the configuration of any of Means 8 through 11, the heat generating unit and the heat sensing unit may be in contact with each other in the overcurrent detecting element (Means 12).

The time for the heat sensing unit to sense the heat generated from the heat generating unit is delayed, so that overcurrent cutoff can be performed in accordance with the smoke-producing characteristics of the wire. When a large amount of current is supplied in a short period of time, however, overcurrent cutoff might not be performed before smoke generation from the wire due to the time delay (overcurrent cutoff is performed after smoke generation), or a device mounted on the circuit might be broken.

With the configuration of Means 12, on the other hand, the heat generating unit and the heat sensing unit are in contact with each other. Accordingly, when a large amount of current is supplied in a short period of time, the heat from the heat generating unit reaches the heat sensing unit in a short period of time (with a smaller time delay). Therefore, even when a large amount of current is supplied in a short period of time, the element for cutting off current can be activated to cut off current before the wire generates smoke or a device is broken. In a case where a relatively small amount of current is supplied or where the increase in current is relatively slow, on the other hand, overcurrent cutoff can be appropriately performed with a time delay in accordance with the resin amount.

In addition to the configuration of Means 12, the heat sensing unit may have a pair of electrode units, and include: a pair of heat-generating-side terminals that lead to the heat generating unit and are connected to a conducting path on a circuit board; and a heat-sensing-side terminal connected to the conducting path on the circuit board, one of the electrode units of the heat sensing unit being placed on and connected to the heat generating unit, the other one of the electrode units of the heat sensing unit being placed on and connected to the heat-sensing-side terminal (Means 13).

With the configuration of Means 13, the current from the heat generating unit can flow into the heat-generating-side terminals and the heat sensing unit, and can be used in detecting temperature. Also, since an electrode unit of the heat sensing unit is placed on and connected to the heat generating unit, the heat from the heat generating unit can easily reach the heat sensing unit. Further, since detection can be performed without two heat-sensing-side terminals, the number of terminals can be made smaller than that in a case where two heat-sensing-side terminals are used.

In addition to the configuration of Means 13, the connection between the one of the electrode units and the heat generating unit, and the connection between the other one of the electrode units and the heat-sensing-side terminal may be performed by brazing or bonding with a conductive adhesive (Means 14).

According to Means 14, the connection between an electrode unit and the heat generating unit, and the connection between an electrode unit and the heat-sensing-side terminal can be certainly performed with a simple structure.

In addition to the configuration of Means 13 or 14, the one of the electrode units may be placed on a turnback portion of the heat generating unit (Means 15).

Since the turnback portion in the heat generating unit tends to have heat generating portions at a high density, the turnback portion readily generates heat. With the configuration of Means 15, one of the electrode units is placed on the turnback portion, and accordingly, the heat generated from the heat generating unit can easily reach the heat sensing unit.

In the configuration of any of Means 8 through 15, the overcurrent detecting element is mounted on a circuit board, and may further include a terminal unit connected to a conducting path on the circuit board, the heat generating unit being integrally formed with the terminal unit and having a smaller diameter than the terminal unit (Means 16).

With the configuration of Means 16, the manufacture of the overcurrent detecting element becomes easier, as the heat generating unit and the terminal unit are integrally formed.

The configuration of any of Means 8 through 16 may further include: a pair of heat-generating-side terminals that lead to the heat generating unit and are connected to a conducting path on a circuit board; and a heat-sensing-side terminal that leads to the heat sensing unit, is connected to the conducting path on the circuit board, and is located parallel to the heat-generating-side terminals. In this configuration, the heat generating unit may have a shape that detours from the extending direction of the heat-generating-side terminals toward the heat sensing unit, and at least part of the heat generating unit may be located below the heat sensing unit (Means 17).

With the configuration of Means 17, the configuration of the overcurrent detecting element can be simplified.

In addition to the configuration of any of Means 8 through 17, when the overcurrent detecting element is mounted on a circuit board, a gap may be formed between the surface of the circuit board and the molded resin section (Means 18).

With the configuration of Means 18, the heat from the circuit board can be prevented from reaching the overcurrent detecting element by the formation of the gap between the circuit board and the molded resin section.

The invention claimed is:

1. An overcurrent cutoff device cutting off overcurrent by activating an element for cutting off current comprising:
   a heat generating unit located in series with a path leading from a power source for a vehicle to a load via a wire,
   a heat sensing unit with characteristics varying with temperature supplied from the heat generating unit,
   an overcurrent detecting element having the heat generating unit and the heat sensing unit integrally covered with a molded resin section, wherein
   the element for cutting off current is activated based on a signal in accordance with temperature obtained from the heat sensing unit.

2. The overcurrent cutoff device according to claim 1, wherein the molded resin section has a resin amount to be set such that heat generated from the heat generating unit is supplied to the heat sensing unit with characteristics in accordance with temperature allowed for the wire and time characteristics.

3. The overcurrent cutoff device according to claim 2, wherein, in the overcurrent detecting element, the temperature obtained at the heat sensing unit and time characteristics are set by a distance between the heat generating unit and the heat sensing unit, as well as by the resin amount in the molded resin section.

4. The overcurrent cutoff device according to claim 1, wherein the molded resin section has a resin amount to be set such that a thermal time constant of the temperature obtained at the heat sensing unit and time characteristics falls within a predetermined range with respect to a thermal time constant of the temperature allowed for the wire and time characteristics.

5. The overcurrent cutoff device according to claim 4, wherein, in the overeurrent detecting element, the temperature obtained at the heat sensing unit and time characteristics are set by a distance between the heat generating unit and the heat sensing unit, as well as by the resin amount in the molded resin section.

6. The overcurrent cutoff device according to claim 1, wherein, in the overcurrent detecting element, the heat generating unit and the heat sensing unit are in contact with each other.

7. The overcurrent cutoff device according to claim 1, wherein a signal in accordance with the temperature obtained from the heat sensing unit is compared with a predetermined threshold value set in accordance with the temperature allowed for the wire, and, based on a result of the comparison, the element for cutting off current is activated to cut off overcurrent.

8. The overcurrent cutoff device according to claim 1, wherein the overcurrent detecting element is mounted on a circuit board, and a gap is formed between a surface of the circuit board and the molded resin section.

9. An overcurrent detecting element to be used in an overcurrent cutoff device cutting off overcurrent by activating an element for cutting off current comprising:
   a heat sensing unit with characteristics varying with temperature supplied from the heat generating unit,
   an overcurrent detecting element having the heat generating unit and the heat sensing unit integrally covered with a molded resin section, wherein
   the element for cutting off current is activated based on a signal in accordance with temperature obtained from the heat sensing unit.

10. The overcurrent detecting element according to claim 9, wherein the molded resin section has a resin amount to be set such that heat generated from the heat generating unit is supplied to the heat sensing unit with characteristics in accordance with temperature allowed for the wire and time characteristics.

11. The overcurrent detecting element according to claim 10, wherein, in the overcurrent detecting element, the temperature obtained at the heat sensing unit and time characteristics are set by a distance between the heat generating unit and the heat sensing unit, as well as by the resin amount in the molded resin section.

12. The overcurrent detecting element according to claim 9, wherein the molded resin section has a resin amount to be set such that a thermal time constant of the temperature obtained at the heat sensing unit and time characteristics falls within a predetermined range with respect to a thermal time constant of the temperature allowed for the wire and time characteristics.

13. The overcurrent detecting element according to claim 10, wherein, in the overcurrent detecting element, the temperature obtained at the heat sensing unit and time characteristics are set by a distance between the heat generating unit and the heat sensing unit, as well as by the resin amount in the molded resin section.

14. The overcurrent detecting element according to claim 9, wherein the heat generating unit and the heat sensing unit are in contact with each other.

15. The overcurrent detecting element according to claim 14, wherein the heat sensing unit has a pair of electrode units, and includes: a pair of heat-generating-side terminals that lead to the heat generating unit and are connected to a conducting path on a circuit board; and a heat-sensing-side terminal connected to the conducting path on the circuit board, one of the electrode units of the heat sensing unit being placed on and connected to the heat generating unit, the other one of the electrode units of the heat sensing unit being placed on and connected to the heat-sensing-side terminal.

16. The overcurrent detecting element according to claim 15, wherein the connection between the one of the electrode units and the heat generating unit, and the connection between the other one of the electrode units and the heat-sensing-side terminal are performed by brazing or bonding with a conductive adhesive.

17. The overcurrent detecting element according to claim 15, wherein the one of the electrode units is placed on a turnback portion of the heat generating unit.

18. The overcurrent detecting element according to claim 9, wherein
the overcurrent detecting element is mounted on a circuit board, and further comprises
a terminal unit connected to a conducting path on the circuit board, the heat generating unit being integrally formed with the terminal unit and having a smaller diameter than the terminal unit.

19. The overcurrent detecting element according to claim 9, further comprising:
a pair of heat-generating-side terminals that lead to the heat generating unit and are connected to a conducting path on a circuit board; and a heat-sensing-side terminal that leads to the heat sensing unit, is connected to the conducting path on the circuit board, and is located parallel to the heat-generating-side terminals,
wherein the heat generating unit has a shape that detours from an extending direction of the heat-generating-side terminals toward the heat sensing unit, and at least part of the heat generating unit is located below the heat sensing unit.

20. The overcurrent detecting element according to claim 9, wherein, when the overcurrent detecting element is mounted on a circuit board, a gap is formed between a surface of the circuit board and the molded resin section.

* * * * *